US011237906B1

(12) United States Patent
Laurent

(10) Patent No.: US 11,237,906 B1
(45) Date of Patent: Feb. 1, 2022

(54) GENERATING A BALANCED CODEWORD PROTECTED BY AN ERROR CORRECTION CODE

(71) Applicant: Micron Technology, Inc., Boise, ID (US)

(72) Inventor: Christophe Vincent Antoine Laurent, Agrate Brianza (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/940,762

(22) Filed: Jul. 28, 2020

(51) Int. Cl.
*G06F 11/10* (2006.01)
*H03M 13/37* (2006.01)

(52) U.S. Cl.
CPC ......... *G06F 11/1076* (2013.01); *H03M 13/37* (2013.01)

(58) Field of Classification Search
CPC .......................... G06F 11/1076; H03M 13/37
See application file for complete search history.

(56) References Cited

U.S. PATENT DOCUMENTS

| 2011/0157992 | A1* | 6/2011 | Strasser | G06F 3/065 365/185.18 |
| 2011/0182119 | A1* | 7/2011 | Strasser | G11C 16/28 365/185.03 |
| 2014/0056068 | A1* | 2/2014 | Strasser | G11C 16/26 365/185.03 |
| 2014/0208181 | A1* | 7/2014 | Daniel | H04L 1/0042 714/752 |
| 2014/0325310 | A1* | 10/2014 | Anholt | G06F 11/1072 714/764 |
| 2015/0212877 | A1 | 7/2015 | Kern et al. | |
| 2015/0303992 | A1* | 10/2015 | Kim | H03K 7/08 455/41.1 |
| 2017/0170869 | A1* | 6/2017 | Chen | H04L 25/085 |
| 2017/0170870 | A1* | 6/2017 | Chen | H04B 3/32 |
| 2017/0255512 | A1 | 9/2017 | Zamir et al. | |
| 2019/0253080 | A1 | 8/2019 | Parthasarathy | |

(Continued)

FOREIGN PATENT DOCUMENTS

WO   2011153000 A2   12/2011

OTHER PUBLICATIONS

U.S. Appl. No. 16/865,163, by Laurent, filed May 1, 2020 (69 pages).

(Continued)

*Primary Examiner* — Kyle Vallecillo
(74) *Attorney, Agent, or Firm* — Holland & Hart LLP

(57) ABSTRACT

Methods, systems, and devices for generating a balanced codeword protected by an error correction code are described. A memory device may receive data bits for storage. Based on the data bits, the memory device may generate a codeword that includes the data bits, parity bits, and placeholder bits. The memory device may balance the codeword by inverting one or more packets of the codeword. After balancing the codeword, the memory device may store at least a portion of the codeword in memory so that a later operation or a decoding process reveals the packets that were inverted as part of the balancing process. Accordingly, the memory device may re-invert the appropriate packets to recover the original data bits.

26 Claims, 15 Drawing Sheets

(56) References Cited

U.S. PATENT DOCUMENTS

2019/0377632 A1 12/2019 Oh et al.
2020/0050512 A1 2/2020 Basu

OTHER PUBLICATIONS

ISA/KR, International Search Report and Written Opinion of the International Searching Authority, Int'l Appl. No. PCT/US2021/041532, Nov. 2, 2021, Korean Intellectual Property Office, Seo-gu, Daejeon, Republic of Korea, 9pg.

ISA/KR, International Search Report and Written Opinion of the International Searching Authority, Int'l Appl. No. PCT/US2021/042173, Nov. 2, 2021, Korean Intellectual Property Office, Seo-gu, Daejeon, Republic of Korea, 9pgs.

* cited by examiner

GENERATING A BALANCED CODEWORD PROTECTED BY AN ERROR CORRECTION CODE

BACKGROUND

The following relates generally to one or more systems for memory and more specifically to generating a balanced codeword protected by an error correction code.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
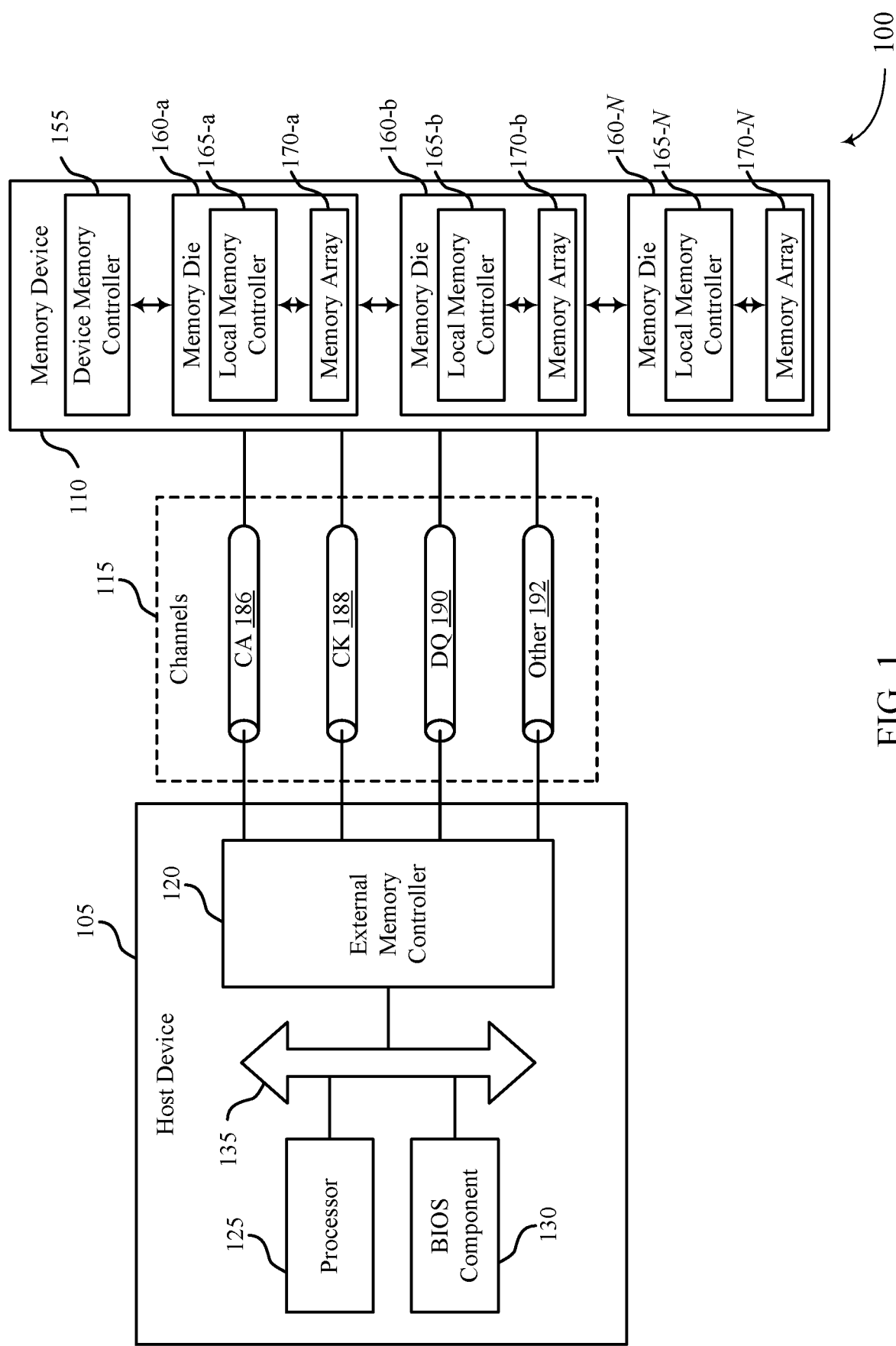
FIG. 1 illustrates an example of a system that supports generating a balanced codeword protected by an error correction code in accordance with examples as disclosed herein.

A memory device may balance a set of data before storing the set of data in memory so that the memory device can implement an improved sensing scheme (e.g., a dynamic reference sensing scheme). Balancing a set of data may refer to a process of inverting bits of the data (which may be logically grouped into packets) until a desirable ratio of different logic states, such as logic '1's and '0's, is reached. To ensure that a balanced set of data can be returned to an earlier form, such as its original form, during a subsequent read operation, a memory device may store balancing information bits that indicate which bits (or packets of bits) were inverted during the balancing process. When the set of data is read from memory, the balancing information bits may also be read so that the memory device can un-invert (e.g., re-invert) the appropriate bit/packets (e.g., those inverted during the balancing process) before returning the set of data to a requesting device.

To increase the reliability of a balanced set of data, which may be corrupted while in storage due to various factors or conditions, it may be desirable to employ an error correction scheme. For example, it may be desirable to protect a balanced set of data using an error correction code that allows the memory device to detect errors in the balanced set of data (and balancing information bits) during an operation, such as a read operation. But the process of balancing a set of data may conflict with the process of applying error correction codes to the set of data. For example, applying an error correction code to a set of data before balancing the set of data may prevent the error correction code from properly protecting the balancing information bits. Alternatively, applying an error correction code after balancing a set of data may result in an unbalanced codeword (e.g., an unbalanced set of data bits, balancing information bits, and parity bits) at least because the parity bits may not be balanced.

Using the techniques described herein, a memory device may generate a set of data that is both balanced and protected by an error correction code. To begin, the memory device may receive a set of data that is to be stored in memory. Upon receipt of the set of data, the memory device may calculate a set of parity bits based on the set of data and a set of placeholder bits that are set to predetermined logic values (e.g., logic '0's). The memory device may then construct a codeword made up of the set of data, the parity bits, and the placeholder bits. The bits of the codeword (e.g., data bits, parity bits, placeholder bits) may be logically mapped to packets such that the validity of the codeword is maintained regardless of which packets are inverted during a balancing process. Thus, the codeword can be balanced (e.g., by inverting one or more packets) without disrupting the efficacy of the error correction code. Put another way, the codeword can be balanced without disrupting the ability of a decoder to detect an error inserted in the balanced codeword after the balancing process.

After balancing the codeword, the memory device may store the data bits and parity bits in memory. In a first example, the memory device may also store the placeholder bits. In a second example, the memory device may refrain from storing the placeholder bits, a technique which may conserve memory cells.

In the first example, the memory device may store the data bits, the parity bits, and the placeholder bits in memory cells associated with the codeword. When the memory device receives a request for the set of data, the memory device may read the stored data bits, the stored parity bits, and the stored placeholder bits from the memory cells associated with the codeword. The memory device may use the stored data bits, the stored parity bits, and the stored placeholder bits to reconstruct the codeword. If the placeholder bit mapped to a packet has a different logic value than the original predetermined logic value for that placeholder bit, the memory device may know that the packet was inverted during the balancing process. Accordingly, the memory device may invert that packet, and other packets similarly indicated, to restore the codeword to it its original form. Thus, the original logic states of the set of data may be recovered from a balanced codeword that is protected by an error correction code.

In the second example, the memory device may store the data bits and the parity bits in memory cells associated with the codeword. However, the memory device may refrain from storing the placeholder bits in some examples, which may conserve memory cells. When the memory device receives a request for the set of data, the memory device may read the stored data bits and the stored parity bits from the memory cells associated with the codeword. The memory device may use the stored set of data, the stored parity bits, and a set of predetermined bits (e.g., in place of the placeholder bits) to reconstruct the codeword. The memory device may decode the reconstructed codeword to detect any errors in the reconstructed codeword. The memory device may interpret the predetermined bits as balancing information bits so that an error detected in the predetermined bits indicates which packets of the codeword were inverting during the balancing process. Thus, the memory device may invert the appropriate packets to restore the codeword—and therefore the set of data—to its original form.

Although described separately, aspects from the first example and the second example can be used in conjunction, as described in greater detail herein.

Figure 6:
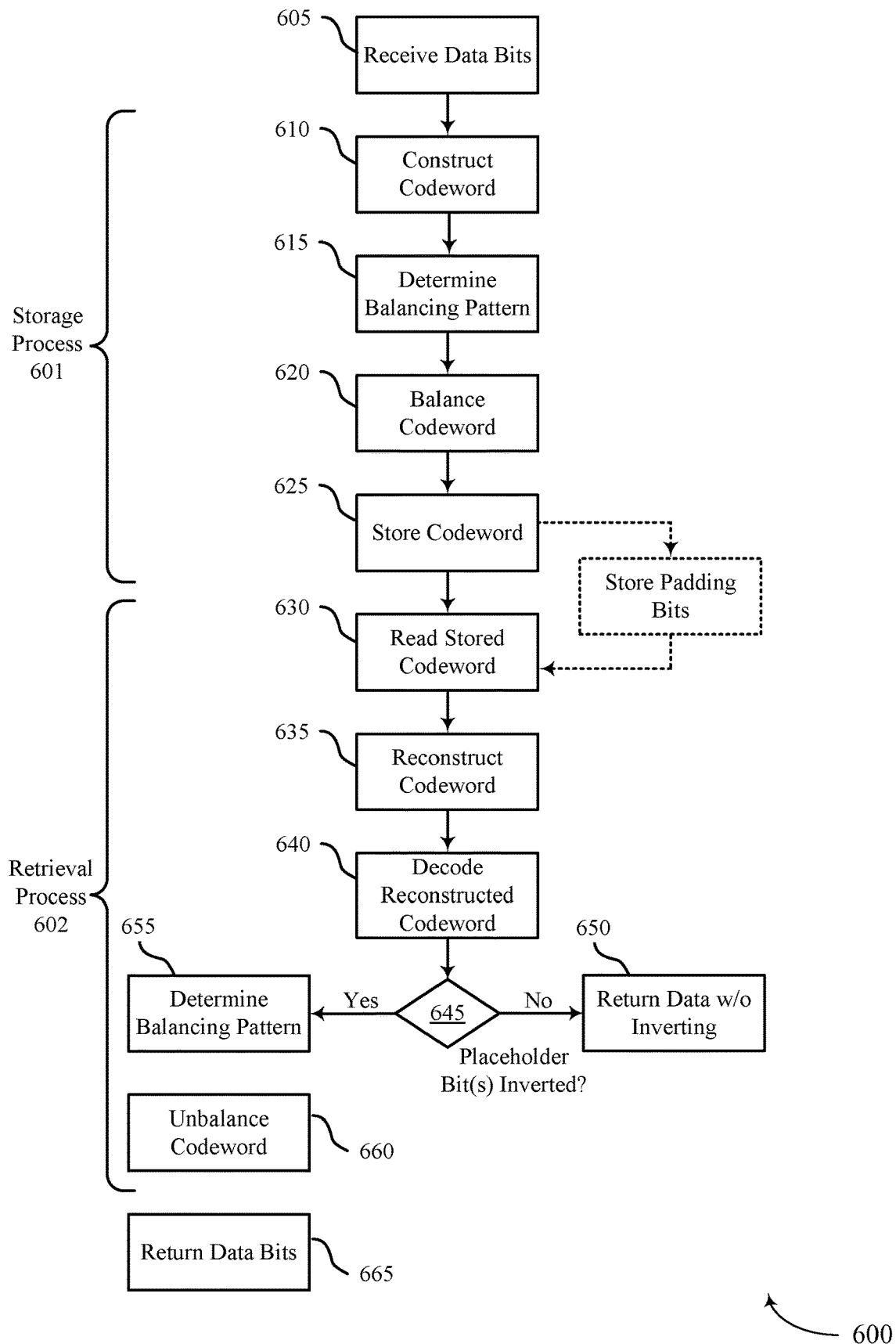
FIG. 6 illustrates an example of a process flow that supports generating a balanced codeword protected by an error correction code in accordance with examples as disclosed herein.
Figure 7:
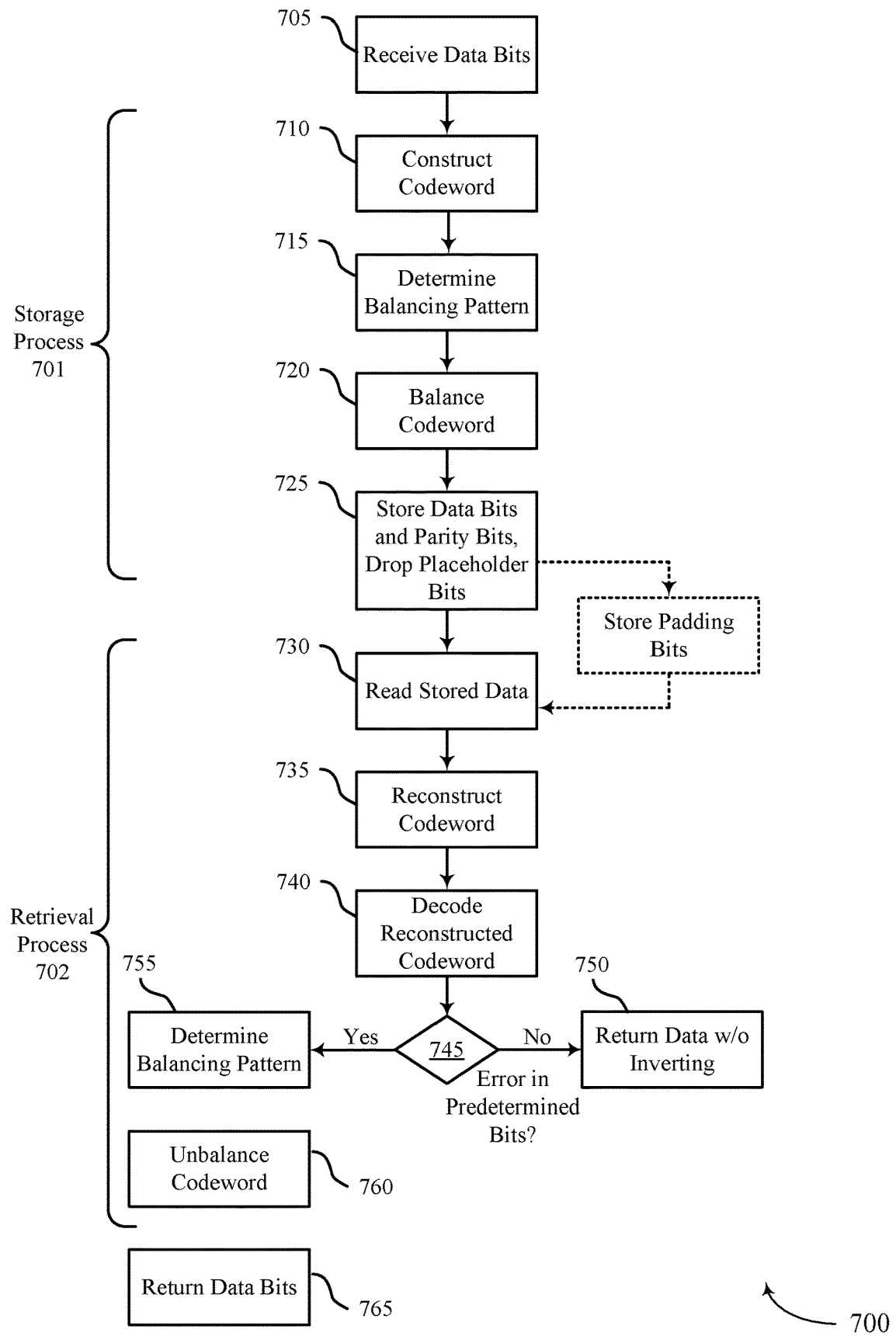
FIG. 7 illustrates an example of a process flow that supports generating a balanced codeword protected by an error correction code in accordance with examples as disclosed herein.

Features of the disclosure are initially described in the context of systems and memory dies as described with reference to FIGS. 1-2. Features of the disclosure are described in the context a balancing scheme, write processes, and read processes, as described with reference to FIGS. 3-5B. Features of the disclosure are also described with reference to process flows as illustrated in FIGS. 6 and 7. These and other features of the disclosure are further illustrated by and described with reference to apparatus diagrams and flowcharts that relate to generating a balanced codeword protected by an error correction code as described with reference to FIGS. 8-13.

FIG. 1 illustrates an example of a system 100 that supports generating a balanced codeword protected by an error correction code in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, data stored in the memory device 110 may become corrupted over time, resulting in one or more errors in the data. To increase the reliability of the memory device 110, the memory device 110 may implement an error correction scheme to detect, identify, and correct such errors. For example, before storing a set of data the memory device 110 may use an error correction code to generate a codeword—made up of the data bits and corresponding parity bits—that can be used by the memory device 110 to detect errors in the codeword. The parity bits may be generated by applying the error correction code to the set of data, which may involve running the set of data through a logic circuit made up of, for example, a series of XOR logic gates. The memory device 110 may store the set of data and the parity bits (collectively referred to as a "codeword") in memory so that one or more errors in the codeword can be detected during a read operation. For example, the memory device 110 may detect an error in the codeword based on syndrome bits that are generated (e.g., during a decoding process) from the bits of the codeword stored in memory.

The logic state stored in a memory cell of the memory device 110 may be sensed by comparing a signal output by the memory cell (e.g., an output current, an output voltage) to a reference signal. Thus, the level of the reference signal may be between the level of an output signal associated with a logic '1' and the level of an output signal associated with a logic '0.' But the signal output by a memory cell may vary with the threshold voltage of the memory cell, which may drift over time. For example, the threshold voltages of memory cells in the memory device 110 may drift (e.g., increase) over time, eventually reaching a point at which a fixed voltage reference (or other reference signal) is unable to differentiate between stored logic '0's and stored logic '1's. As an illustration, the threshold voltages of memory cells storing logic '0's may increase until the memory cells output voltages greater than the fixed voltage reference, causing the memory device 110 to erroneously interpret logic '0's as logic '1's. To compensate for drift and mitigate the reliability issues that arise from drift, the memory device 110 may implement a dynamic reference sensing scheme that relies on the storage of balanced data.

Balanced data may refer to data that has equal (or nearly equal) quantities of bits assigned as logic '1's and logic '0's. To ensure that data is balanced before storage, the memory device 110 may map the data to packets and employ a balancing process in which the packets are inverted one at a time until the data has been balanced or a predetermined weight has been achieved. The weight of a set of data may refer to quantity bits in the set of data that are logic '1's (e.g., data with ten logic '1's may have a weight of 10). To ensure that the original logic values of balanced data can be accurately recovered during a subsequent read operation, the memory device 110 may store balancing information bits that indicate which packets of the data were inverted during the balancing process. During a read operation, the memory device 110 may reference the balancing information bits so that the memory device 110 can un-invert the proper packets of the data (e.g., those inverted during the balancing process) before the data is returned to a requesting device.

Balancing data before storage may allow the memory device 110 to implement various techniques that improve operation of the memory device 110. For example, as noted above, storing balanced data may facilitate the use of a dynamic reference sensing scheme that mitigates the negative effects of threshold voltage drift.

A dynamic reference sensing scheme may involve the memory device 110 incrementally increasing the reference voltage (or current) used to sense memory cells that store balanced data. Specifically, after each sensing operation the memory device 110 may increase the reference voltage used to sense the memory cells until the quantity of logic '1's sensed from the set of memory cells is equal to (or nearly equal to) the quantity of logic '0's sensed from the memory cells. Put another way, the memory device 110 may increase the reference voltage used to sense the memory cells until the weight of the data sensed from the memory cells is equal to the weight of the data before the data was stored in the memory cells. When the weight of the sensed data is equal to the weight of the stored data, the memory device 110 may know that the level of last-used reference voltage is an appropriate level to accurately sense the data.

Thus, balanced data may enable the use of a dynamic reference sensing scheme, which in turn may increase the reliability of a memory device that is susceptible to threshold voltage drift.

But, like other data, balanced data may become corrupted while in storage, resulting in one or more errors in the balanced data. To detect and correct such errors during a read operation, the memory device 110 may wish to protect the balanced data with an error correction code. But applying the error correction code to already balanced data may result in a codeword that is unbalanced, because the parity bits were not accounted for during the balancing process. Alternatively, balancing a codeword protected by an error correction code may prevent the memory device 110 from detecting errors in the balancing information bits, which are determined after the parity bits are generated and thus are unprotected by the error correction code.

According to the techniques described herein, the memory device 110 may generate a balanced codeword that is protected by an error correction code. The memory device 110 may begin by generating a codeword of data bits, parity bits, and placeholder bits (which help the memory device 110 determine balancing information for the codeword in a subsequent read operation). After generating the codeword, the memory device 110 may balance the codeword, if it is not already balanced, by inverting one or more packets of bits. The packets of bits may be groups of bits that, when collectively inverted, maintain the validity of the codeword so that a later decoding process does not recognize that the bits were inverted. After balancing the codeword (or after determining that the codeword is already balanced), the memory device 110 may store the data bits and the parity bits in memory (e.g., in a memory array 170).

In accordance with a first technique, the memory device 110 may also store the placeholder bits in the memory. Alternatively, in accordance with a second technique, the memory device 110 may refrain from storing the placeholder bits in memory. Both techniques may allow the memory device 110 to later determine the balancing information for the codeword. The two techniques may provide different advantages. For example, among other advantages, the first technique may allow the memory device 110 to use a simpler error correction code relative to the second technique. And the second technique may allow the memory device 110 to use fewer memory cells—relative to the first technique—to store the codeword, among other advantages.

Referring to the first technique, the memory device 110 may store the data bits, the parity bits, and the placeholder bits of a codeword in memory (e.g., in a memory array 170). When the memory device 110 receives a request for the data bits, the memory device 110 may implement a dynamic reference sensing scheme to sense the stored data bits, the stored parity bits, and the stored placeholder bits. But, the memory device 110 may still need to look for errors in the codeword, and possibly unbalance the codeword, before it can return the data bits to the requesting device. Accordingly, the memory device 110 may use the stored data bits, the stored parity bits, and the stored placeholder bits, to reconstruct the codeword. Because each placeholder bit is mapped to a respective packet, the memory device 110 may determine whether a packet was inverted (e.g., during the pre-storage balancing process) by comparing the logic value of the placeholder bit for packet with the original logic value of the placeholder bit. If the placeholder bit no longer has its original logic value, the device 110 may know that the associated packet was inverted during the balancing process. Accordingly, the memory device 110 may invert the packet—and any other similarly indicated packets—to unbalance the codeword, thereby recovering the original logic values of the data bits.

Referring to the second technique, the memory device 110 may store the data bits and the parity bits, but not the placeholder bits, in memory. When the memory device 110 receives a request for the data bits, the memory device 110 may implement a dynamic reference sensing scheme to sense the stored data bits and the stored parity bits. But, as noted, the memory device 110 may still need to look for errors in the codeword, and possibly unbalance the codeword, before it can return the data bits to the requesting device. Accordingly, the memory device 110 may use the stored data bits and the stored parity bits, along with a predetermined set of bits, to reconstruct the codeword. The predetermined set of bits may take the places of the placeholder bits in the codeword and may be interpreted as balancing information bits. This way, when a decoding process performed on the reconstructed codeword detects an error in the predetermined set of bits, the memory device 110 may determine the balancing information for the codeword based on the location of the error in predetermined set of bits. Once the balancing information is determined, the memory device 110 may unbalanced the codeword according to the balancing information so that the data bits are ready to be returned to the requesting device.

Thus, the memory device 110 may generate, and use, a balanced codeword that is protected by an error correction code. Although described as separate techniques, it should be understood that aspects of the first technique and the second technique can be combined to realize one or more aspects of the advantages described herein.

Figure 2:
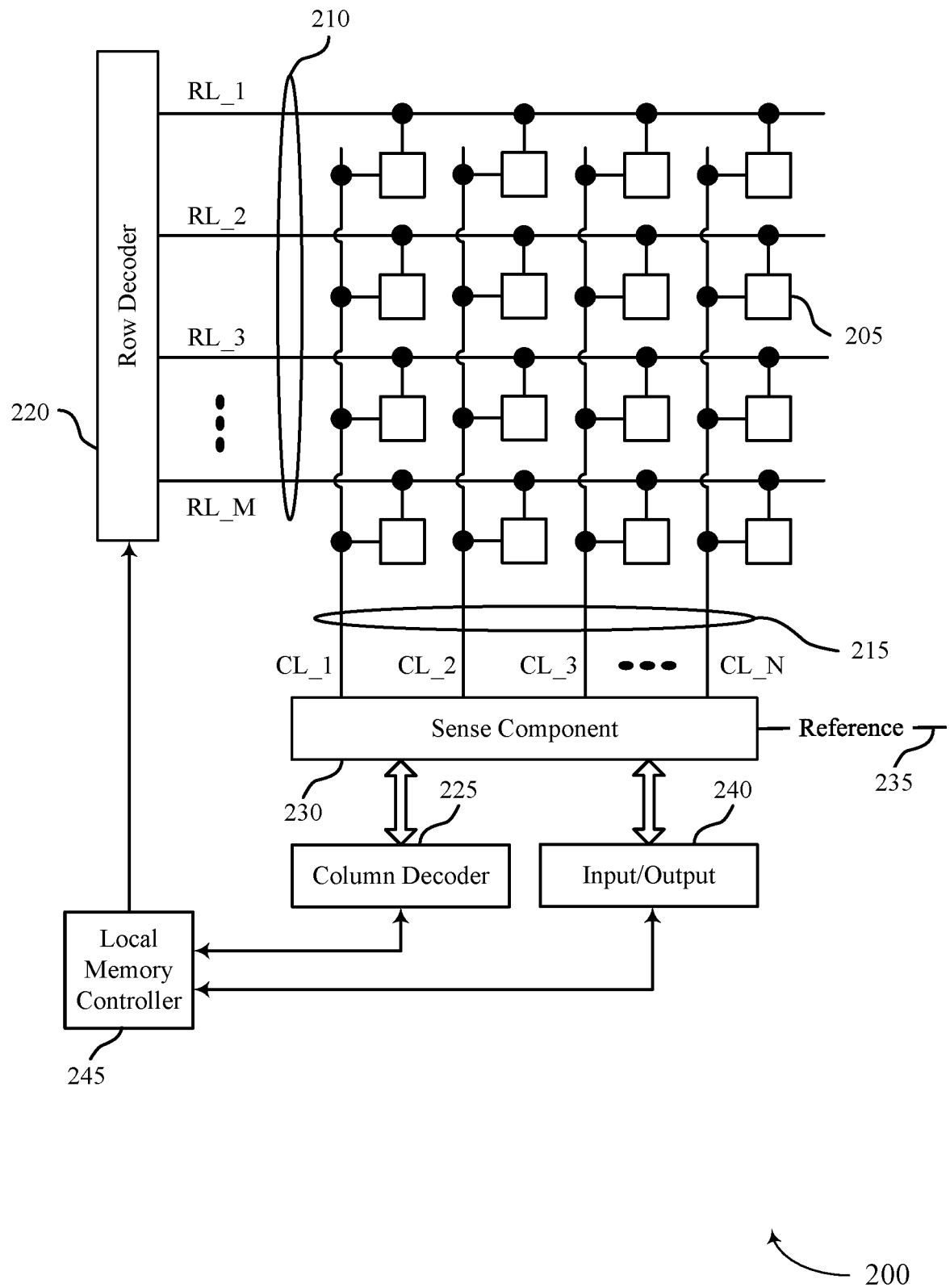
FIG. 2 illustrates an example of a memory die that supports generating a balanced codeword protected by an error correction code in accordance with examples as disclosed herein.

FIG. 2 illustrates an example of a memory die 200 that supports generating a balanced codeword protected by an error correction code in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

In some examples, the memory die 200 may apply an error correction code to data before writing the data to the memory cells 205. An error correction code may be capable of protecting a threshold quantity of bits, such as $2^N-1$ bits, and different error correction codes may have different strenghts or powers, which may refer to the quantity of errors an error correction code can detect and correct. For example, an error correction code that is capable of detecting and correcting two errors in a set of x bits may be referred to as having a higher power than an error correction code that is only capable of detecting and correcting one error in a set of x bits. The quantity of errors that an error correction code can detect and correct may be denoted herein by a number following the error correction code (e.g., ECC1, ECC2).

If an error correction code is used to protect fewer bits than the error correction code is capable of protecting, the unused bits (referred to as "shortened bits") of the error correction code can be dropped. At the design stage, dropping a shortened bit of an error correction code may involve omitting the logic gates associated with the shortened bits. However, according to the techniques described herein, at least some shortened bits may be retained so that placeholder bits can be input into the encoder (e.g., input into the logic gates associated with the shortened bits). Alternatively, the logic gates associated with the shortened/placeholder bits may be omitted and the encoder may be configured to use default logic values in place of the shortened bits/placeholder bits.

In addition to power or strength, an error correction code may have other properties, such as distance. The distance of an error correction code may refer to the minimum quantity of bits that can be different between two valid codewords generated using the error correction code. As an example, the distance of ECC1 may be three, meaning that at least three bits of a codeword protected by ECC1 must be inverted for the validity of the codeword to be preserved. Similarly, the distance of ECC2 may be five, meaning that at least five bits of a codeword protected by ECC2 must be inverted for the validity of the codeword to be preserved. A codeword is valid if a decoding process performed on the codeword does not detect any errors in the codeword. It should be appreciated that only certain combinations of bits in a codeword, when collectively inverted, preserve the validity of the codeword. The combinations of bits may be a function of the matrix (or "Hamming code") used to generate the syndromes.

According to the techniques described herein, a device such as the memory die 200 may map bits of a codeword to packets that, when inverted, maintain the validity of the codeword even though codeword has been modified. To accomplish this, the device may ensure that the size of the packets is greater than or equal to the distance of the error correction code (otherwise, inverting a packet would invert an insufficient quantity of bits to maintain validity). Thus, when a device such as the memory die 200 divides a set of data into packets, the distance of an error correction code may serve at least one basis for selecting the size of packets.

As described herein, an error correction code may protect a balanced codeword, which may be used by a memory device to implement a dynamic reference sensing scheme that mitigates the effects of drift.

Figure 3:
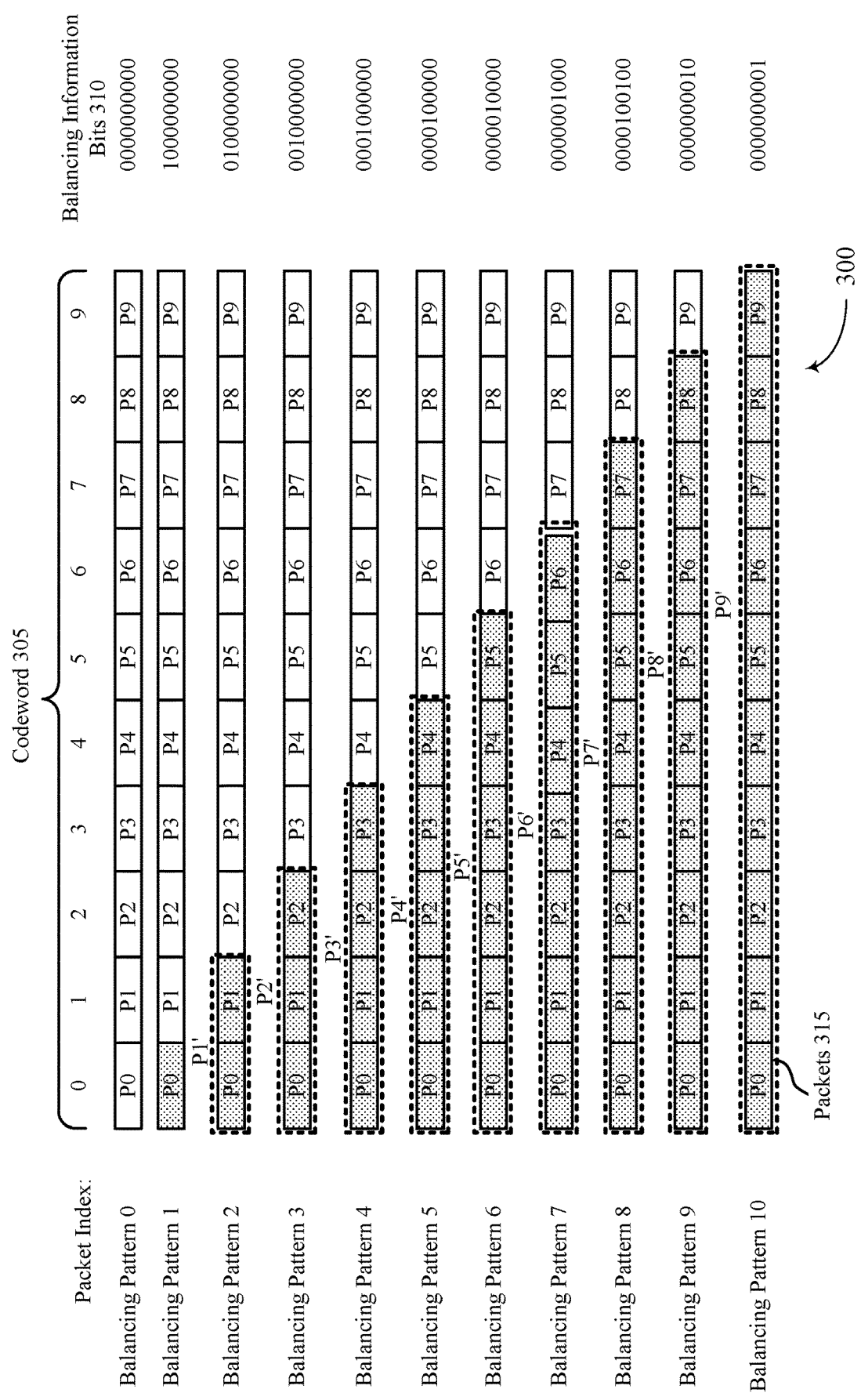
FIG. 3 illustrates an example of a balancing scheme that supports generating a balanced codeword protected by an error correction code in accordance with examples as disclosed herein.

FIG. 3 illustrates an example of a balancing scheme 300 that supports generating a balanced codeword protected by an error correction code in accordance with examples as disclosed herein. The balancing scheme 300 may illustrate different balancing patterns for codeword 305. The balancing scheme 300 may also illustrate balancing information bits 310 that are used to represent the balancing patterns for the codeword 305. As described herein, the balancing patterns may be used to balance the codeword 305 so that a dynamic reference sensing scheme can be used to sense the codeword during a read operation. Further, the coding scheme used for the balancing information bits 310 may allow a device using the second technique described herein (e.g., a device that does not store the balancing information bits 310) to determine the balancing pattern for the codeword 305 during a read operation.

The codeword 305 may include data bits, parity bits, and placeholder bits. Before storing the codeword 305 in memory, the device may divide (e.g., conceptually, logically) the codeword 305 into packets for a balancing operation. For example, the device may group the bits in the codeword 305 into packets 315, which may be sequentially indexed, and which may have dimensions d. The dimension of a packet may refer to the quantity of bits in the packet. As an example, if the codeword 305 is 100 bits then the device may divide the codeword 305 into ten packets with a dimension of ten (d=10). It should be understood that the bits in a packet can include different types of bits such as data bits, parity bits, and placeholder bits. Further, the bits in a packet need not be adjacent to each other in the codeword 305 (e.g., bits from various positions in the codeword 305 can be mapped to a packet). The dimension of a packet may also be referred to as the size of the packet or other suitable terminology.

As explained above, the dimension of the packets 315, and thus the quantity of packets 315, may be determined based on the distance of the error correction code to be applied to the codeword 305. For example, the dimensions of the packets 315 may be greater than or equal to the distance of the error correction code so that every packet 315 has at least the minimum quantity of bits required for the codeword 305 to maintain validity after inversion of that packet. As an illustration, if the error correction code has a distance of five, the device may ensure that each packet 315 has five or more bits. So, by satisfying this condition (e.g., packet dimension≥ECC distance), the device may be able to invert any of the packets 315 without invalidating the codeword. Although described with reference to a common dimension, one or more of the packets 315 in the codeword 305 may have different dimensions.

Inverting a packet 315 may, in some examples, involve inverting (e.g., toggling, changing the logic value of) each and every bit of the packet 315. After dividing the codeword 305 into the packets 315, the device may determine which packets, if any, should be inverted to achieve a desired balance. Put another way, the device may determine which balancing pattern to use. The device may analyze the codeword 305 to determine whether the codeword 305 already has the desired balance (e.g., the device may determine whether the codeword 305 is already quasi-balanced, perfectly balanced, or has a target fixed weight). If so, the device may conclude the analysis, refrain from inverting any packets, update the balancing information bits 310 to reflect balancing pattern 0, and perform a write process for the codeword 305. But, if the codeword 305 does not already have the desired balance, the device may analyze the codeword 305 to determine whether inverting the first packet (packet 0, denoted "P0") will result in the desired balance.

If the device determines that inverting the first packet P0 will result in the desired balance, the device may discontinue the analysis, update the balancing information bits 310 to reflect balancing pattern 1, and invert the first packet P0. If the device determines that inverting the first packet P0 will not result in the desired balance, the device may determine whether inverting the first packet P0 and the next-indexed packet (packet 1, denoted "P1") will result in the desired balance. The device may continue sequentially (and cumulatively) adding packets to the analysis until the device determines the balancing pattern that will result in the desired balance. Although described with reference to a particular balancing approach, the techniques described herein can be implemented using other balancing approaches and are not limited to the balancing approach described herein.

In some examples, the device may desire a quasi-balanced codeword. A quasi-balanced codeword may refer to a codeword that has an amount of logic values (e.g., logic '1's) within a threshold range or a ratio of logic values (e.g., logic '1's and logic '0's) that falls within a threshold range of ratios. In various examples, the device may desire a fixed weight codeword, which may refer to a codeword that has a predetermined quantity of a particular logic value (e.g., logic '1'). In various examples, the device may desire a perfectly balanced codeword, which may refer to a codeword that has the same quantity of logic '1's as logic '0's. As discussed herein, a quasi-balanced codeword, fixed weight codeword, or perfectly balanced codeword may allow a device to implement a dynamic reference sensing scheme, which may mitigate reliability issues caused by threshold voltage drift. In some examples, a perfectly balanced codeword may provide advantages over other the balancing schemes, such as enabling a device to determine a dynamic reference voltage that is perfectly centered (e.g., a dynamic reference voltage that is midway between levels output by memory cells storing logic '1's and levels output by memory cells storing logic '0s').

As noted, the balancing information bits 310 may be used to represent or indicate the balancing pattern applied to the codeword 305. In some examples, One Hot Coding may be used for the balancing information bits 310. In One Hot Coding, only a single bit is permitted to be a logic '1' at any given time. By associating each balancing information bit with a respective packet of the codeword 305, the device may indicate which packet(s) were inverted by setting the bit associated with the last packet (index-wise) inverted. For example, if balancing pattern 4 is selected by the device, the device may indicate balancing pattern 4 by setting the fourth bit in the balancing information bits 310. Because the fourth bit is associated with the fourth packet of the codeword 305, the device may know that the first four packets (e.g., P0, P1, P2, and P3) were inverted.

Because each balancing information bit is associated with a respective packet of the codeword 305, it follows that the quantity of balancing information bits 310 is equal to the quantity of packets in the codeword 305.

Thus, the balancing information bits 310 may be used to indicate the balancing pattern applied to the codeword 305. As described herein, using One Hot Coding for the balancing information bits 310 may provide a distinct advantage compared to other coding techniques. For example, using One Hot Coding for the balancing information bits 310 may allow a device to determine the balancing pattern for the codeword 305 without the device storing the balancing information bits 310 is memory, which conserves memory resources. However, the techniques described herein can be implemented using coding techniques other than One Hot Coding for the balancing information bits 310.

For example, other types of Hot Coding such as x Hot Coding may be used for the balancing information bits 310. In an x Hot Coding scheme, x bits of the balancing information bits 310 are permitted to be logic '1's at any given time. For example, in Two Hot Coding, two bits of the balancing information bits 310 are permitted to be logic 1's at any given time. When a device uses Two Hot Coding for the balancing information bits 310, the device may use a combination of the first technique and the second technique when storing the codeword. For example, the device may store half of the balancing information bits (e.g., as placeholder bits) in memory and replace the other half of the balancing information bits with predetermined bits at the decoding stage.

In some examples, the second technique described herein may be used in conjunction with One Hot Coding. To use the second technique with One Hot Coding, the memory device may re-map the bits of the codeword 305 as new balancing patterns are tested. For example, upon determining that balancing pattern 1 is insufficient to balance the codeword 305, the memory device may test balancing pattern 2. To do so, the memory device may re-map the bits in the codeword 305 so that a new packet P1' is defined, among other packets 315. The new packet P1' may be a combination of packet 0—minus the placeholder bit mapped to packet 0, which represents the balancing information for packet 0—plus some additional data bits and/or parity bits. The new packet P1' may also include a placeholder bit that represents the balancing information bit for packet P1'. Thus, the new packet P1' may have a single placeholder bit that is one of nine placeholder bits in the codeword 305 (because there is one balancing bit per packet and the construction of new packet P1' results in nine packets). As before, the bits mapped to the new packet P1' may be such that inversion of the new packet P1' does not negate the validity of the codeword 305.

Put generally, a packet Px+1' may include the data bits and parity bits of packet Px' but not the placeholder bit for Px'. Thus, packet P2' may include the data bits and parity bits of packet P1', but not the placeholder bit of packet P1'. And so on and so forth for packets P3' through P9'. Of course, to be a meaningful test of a new balancing pattern, the packet Px+1' may also include additional data bits and/or parity bits plus a placeholder bit for indicating the balancing pattern. The bits mapped to packets 315 may be different for each balancing pattern and the leading packet dimension (e.g., the dimension of the lowest-indexed packet) may increase per balancing pattern. Thus, an indication of a balancing pattern may also indicate the mapping used for that balancing pattern.

With each subsequent reconstruction of packets in the non-cumulative mapping scheme, the quantity of balancing bits (and thus representative placeholder bits) used to indicate the balancing patterns may be reduced to match the quantity of packets, in some examples. Thus, as described in more detail with respect to FIGS. 5A and 5B, inversion of a packet may be indicated by an error in the placeholder bit mapped to that packet. As an example, inversion of packet P4' may be indicated by an error in the placeholder bit mapped to packet P4' (e.g., the balancing information bits, reconstructed from the placeholder bits, may be '0001000000').

Thus, One Hot Coding may allow a memory device to implement the second technique described herein in which the placeholder bits for a codeword are dropped before the codeword is stored in memory.

Figure 4A:
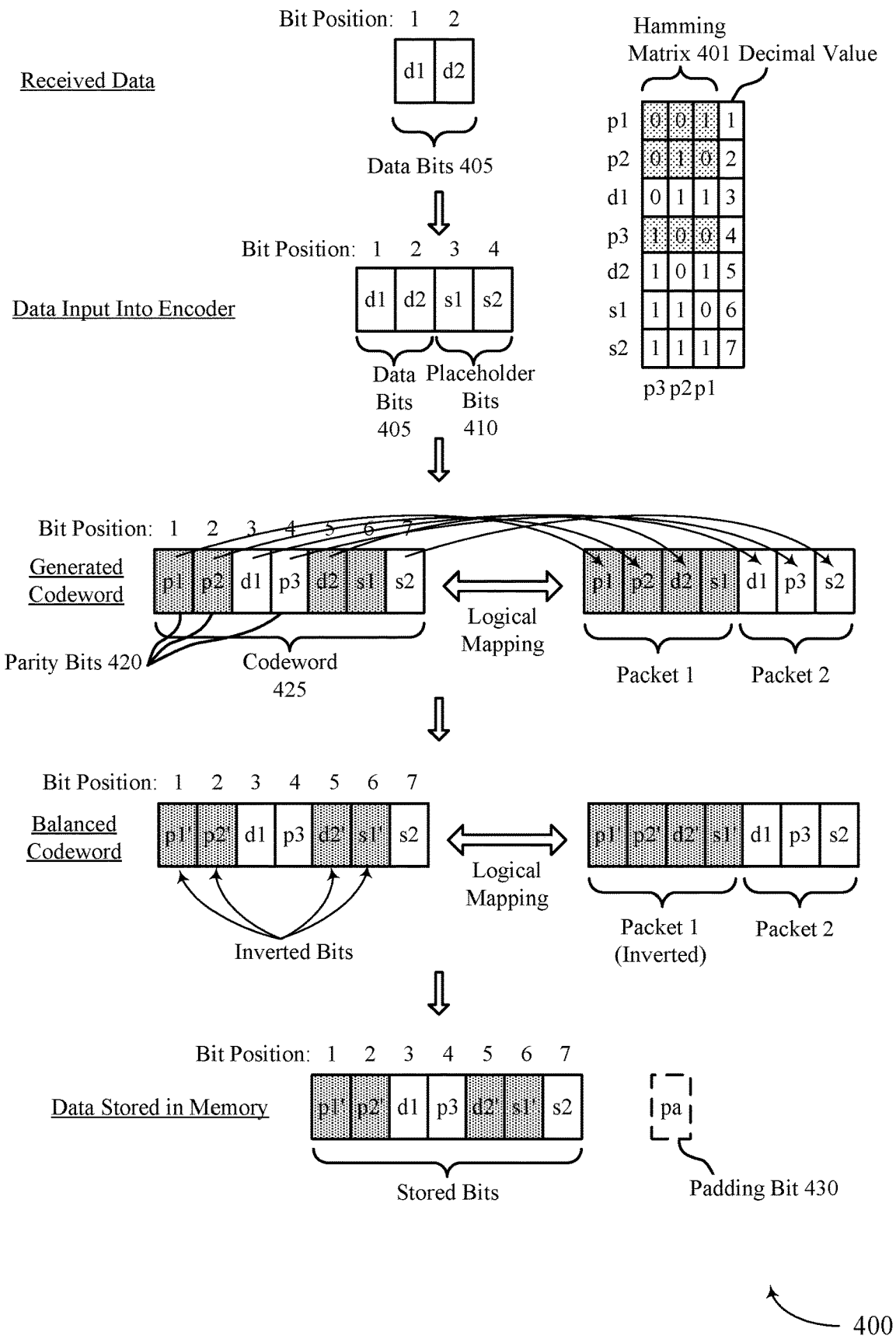
FIG. 4A illustrates an example of bits during a write process that supports generating a balanced codeword protected by an error correction code in accordance with examples as disclosed herein.

FIG. 4A illustrates an example of bits 400 that support generating a balanced codeword protected by an error correction code in accordance with examples as disclosed herein. The bits 400 illustrate various arrangements of bits (e.g., data bits 405, placeholder bits 410, parity bits 420, padding bits 430) at different stages of a write process for a set of data using the first technique described herein. Thus, the write process may involve storing the data bits 405, the placeholder bits 410, the parity bits 420, and optionally the padding bit(s) 430. Compared to the write process described with reference to FIG. 5A, the write process described with reference to FIG. 4A may use a lower power error correction code, which may reduce complexity, latency, and/or power, among other benefits. As discussed below, the write process may generate for the set of data a codeword 425 that is both balanced and protected by an error correction code.

To generate the codeword 425, a device may use a matrix such as Hamming matrix 401. For ease of illustration the described Hamming matrix 401 is an example of ECC1 (e.g., an error correction code only capable detecting and correcting a single error). However, it should be appreciated that the first technique described herein may involve a higher-power error correction code so that additional errors in the codeword 425 can be detected and corrected.

The write process may begin with a device receiving data bits 405 and an associated write command that indicates the device is to store the data bits 405 in memory. The data bits 405 may include a first data bit (d1) in a first position and a second data bit (d2) in a second position. Thus, in the given example, there may be two data bits 405 that the device is to store in memory. But, as noted, the techniques described herein can be implemented for any quantity of data bits 405. For example, to accommodate a different quantity of data bits, a different Hamming matrix may be used.

After receiving the data bits 405, the device may add placeholder bits 410 to the data bits 405, which may enable to device to determine balancing information for the codeword 425 in a subsequent read operation. In some examples, the placeholder bits 410 may be referred to as balancing information bits (because they are used to indicate the balancing pattern for the codeword 425), flag bits (because they are used to indicate packets inverted during a subsequent balancing process), or other suitable terminology.

The placeholder bits 410 may include a first placeholder bit (s1) and a second placeholder bit (s2). The quantity of placeholder bits 410 added to the data bits 405 may be equal to the quantity of packets to which the codeword 425 is mapped (e.g., so that each packet can include a respective placeholder bit 410). The logic values of the placeholder bits 410 may be predetermined (e.g., independent of the logic values of the data bits 405). For example, the placeholder bits 410 may have logic values of logic '0' regardless of the logic values of the data bits 405.

In some examples, adding the placeholder bits 410 to the data bits 405 may involve inputting the placeholder bits 410 and the data bits 405 into an encoder or generating the placeholder bits 410 at the encoder. Thus, the data operated on by the encoder may include the data bits 405 and the placeholder bits 410. In some examples, the placeholder 410 bits may take the place of shortened bits that would otherwise be dropped. For instance, the placeholder bits 410 may be input into, or generated by, components of the encoder that would otherwise be unused (e.g., because the encoder is designed to protect a greater quantity of bits than the data bits 405).

As noted, the placeholder bits 410 may be set to a predetermined logic value (e.g., logic '0'), which may facilitate determination of the balancing pattern for the codeword 425 during a read process that follows the write process. Because the placeholder bits 410 are set to predetermined logic values, the placeholder bits 410 operated on by the encoder may be internally generated by the encoder (e.g., by considering certain inputs as logic '0's) or input into the encoder from memory cells or a voltage reference hardwired or otherwise permanently coupled with the encoder.

The encoder may use the data bits 405 and the placeholder bits 410 to generate parity bits 420 (and thus the codeword 425). For example, the encoder may apply the Hamming matrix 401 (or "Hamming code") so that various combinations of the data bits 405 and placeholder bits 410 are XOR'd to create the parity bits 420.

To understand how the encoder generates the parity bits, it should be appreciated that each row of the Hamming matrix 401 may be associated with a different bit of the codeword 425, which is made up of the data bits 405, the placeholder bits 410, and the parity bits 420. For example, the first row of the Hamming matrix 401 may be associated with the first parity bit (p1), the second row of the Hamming matrix 401 may be associated with the second parity bit (p2), the third row of the Hamming matrix 401 may be associated with the first data bit (d1), and so on and so forth as illustrated in FIG. 4A. For ease of reference the rows associated with parity bits are shaded. In addition to being associated with a respective row, each parity bit may be associated with a respective column of the Hamming matrix 401. For example, the first parity bit (p1) may be associated with the third column of the Hamming matrix 401, the second parity bit (p2) may be associated with the second column of the Hamming matrix 401, and the third parity bit (p3) may be associated with the first column of the Hamming matrix 401.

To generate a parity bit, the encoder may XOR the data bits 405 and/or the placeholder bits 410 indicated by the column associated with that parity bit. For example, to generate the first parity bit (p1), the encoder may XOR the first data bit (d1), the second data bit (d2), and the second placeholder bit (s2). Similarly, to generate the second parity bit (p2), the encoder may XOR the first data bit (d1), the first placeholder bit (s1), and the second placeholder bit (s2). And to generate the third parity bit (p3), the encoder may XOR the second data bit (d2), the first placeholder bit (s1), and the second placeholder bit (s2). Although described with reference to XOR operations, it should be appreciated that the techniques described herein can be implemented using other types of logic operations.

Upon generating the parity bits, the device may generate the codeword 425 with each bit positioned in the codeword 425 as indicated by the Hamming matrix 401. Thus, the first parity bit (p1) may be in the first position of the codeword 425, the second parity bit (p2) may be in the second position of the codeword 425, the first data bit (d1) may be in the third position of the codeword 425, and so on and so forth as illustrated. Thus, in the given example, the codeword 425 may include seven bits in seven positions. However, the first technique described herein can be implemented for codewords of any dimension.

According to the techniques described herein, each bit in the codeword 425 may be mapped to a packet (or, put another way, each bit in the codeword 425 may be associated with a packet). For example, the following bits may be mapped to Packet 1: the first parity bit (p1), the second parity bit (p2), the second data bit (d2), and the first placeholder bit (s1). And the following bits may be mapped to Packet 2: the first data bit (d1), the third parity bit (p3), and the second placeholder bit (s2). For ease of reference the bits mapped to Packet 1 are shaded. The bits mapped to a packet may be collections of bits that, when inverted together, maintain the validity of the codeword 425. For example, the bits mapped to Packet 1 (p1, p2, d2, s1) may be chosen so the validity of the codeword 425 is maintained even if Packet 1 is inverted. Similarly, the bits mapped to Packet 2 (d1, p3, s2) may be chosen so the validity of the codeword 425 is maintained even if Packet 2 is inverted. Because a packet represents a logical collection of bits, inverting a packet may refer to the inversion of each bit mapped to the packet. Thus, inverting Packet 1 may include inverting the bits mapped to Packet 1 (p1, p2, d2, s2).

As described herein, the validity of a codeword is maintained if a decoding process is unable to detect errors that have been inserted into the codeword. To illustrate how Packet 1 can be inverted without destroying the validity of the codeword 425, consider the decoding process for codeword 425. To decode the codeword 425, the device may generate a first syndrome bit by XORing all the bits indicated in the column associated with the first parity bit (p1). The device may generate a second syndrome bit by XORing all the bits indicated in the column associated with the second parity bit (p2). And the device may generate a third syndrome bit by XORing all the bits indicated in the column associated with the third parity bit (p3). If all three syndrome bits are zero, the device may determine that the codeword is valid (e.g., no errors are detected). If one or more of the three syndrome bits are non-zero, the device may determine that the codeword 425 is invalid (e.g., an error is detected). In addition to indicating an error, the syndrome bits may identify which bit in the codeword has the error (for example, syndrome bits '110' indicate that the error is in the sixth bit of the codeword because the decimal equivalent of binary '110' is six).

The use of such a decoding technique allows the device to invert Packet 1 (and/or Packet 2) without invalidating the codeword 425 (provided that an appropriate combination of bits are mapped to Packet 1 and Packet 2). To illustrate, consider an inversion of Packet 1, which may occur as part of a balancing process for the codeword 425. According to the bit-map for Packet 1, inverting Packet 1 involves inverting p1 to p1', p2 to p2', d2 to d2', and s1 to s1', where the prime marking denotes an inverted bit. But, despite the inversions, the validity of the codeword 425 is maintained due to the strategic mapping of bits to Packet 1.

Working out a simple example demonstrates this property. Consider a scenario in which the codeword 425 is made up of all zeros (e.g., the codeword 425 is '0000000'). Upon inverting Packet 1, the codeword 425 becomes '1100110' (because p1, p2, d2, and s1 are inverted). Thus, the codeword 425 is quasi-balanced. To generate the syndrome bits for the codeword 425, the decoder may XOR bit combinations of the balanced codeword 425 as indicated by the Hamming matrix 401. For example, the decoder may XOR (p1', d1, d2', s2) to generate the first syndrome bit, XOR (p2', d1, s1', s2) to generate the second syndrome bit, and XOR (p3, d2', s1', s2) to generate the third syndrome bit. Plugging in the appropriate values for the bits means that the first syndrome bit is equal to XOR (1, 0, 1, 0)=0; the second syndrome bit is equal to XOR (1, 0, 1, 0)=0; and the third syndrome bit is equal to XOR (0, 1, 1, 0)=0. Thus, no errors are detected in the balanced codeword 425, despite the inversion of the four bits (p1, p2, d2, s1) mapped to Packet 1.

However, it should be appreciated that because the validity of the balanced codeword 425 has been maintained, the decoder is still able to detect an error that arises or is inserted in the balanced codeword 425 after the balancing process. When the first technique described herein is used, an error detected by the decoder may be an unintentional error that arises while the codeword is stored in memory. When the second technique described herein is used (e.g., with reference to FIGS. 5A and 5B), the error detected by the decoder may be an intentional error (e.g., in the placeholder bits 410) that indicates the balancing pattern used on the codeword 425. In both techniques, additional errors (e.g., one or more unintentional errors) in the codeword 425 may be detected by using a higher-power error correction code (e.g., ECC2 or higher).

It should be appreciated that only certain combinations of bits can be inverted without invalidating a codeword such as the codeword 425. Such combinations can be determined using the Hamming matrix for the codeword, such as Hamming matrix 401. For example, the bits that can be collectively inverted without invalidating the codeword 425 may be the bits associated with rows of the Hamming matrix 401 that, when the corresponding columns of the Hamming matrix 401 are summed, result in an even quantity of logic '1's. As an example, consider the bits in Packet 2 (d1, p3, s2). When the columns associated with these bits are summed, the resulting quantity of logic '1's for each column is an even number (e.g., two). Thus, the bits of the codeword 425 may be intelligently mapped to packets based on the Hamming matrix 401. Stated more generically, the bits of a codeword may be mapped to packets based on the Hamming matrix used to generate the codeword.

As an additional design factor for the first technique, the bits of a codeword may be mapped to packets so that each bit is mapped to a single packet (as opposed to some bits being un-mapped, or some bits being mapped to multiple packets). This way, the entire codeword is mapped to the packets. Such a design technique is illustrated in the mapping of codeword 425, which shows that each bit (p1, p2, d1, p3, d2, s1, s2) is mapped to one of Packet 1 or Packet 2. Further, in some examples the mapping may ensure that a single placeholder bit 410 is mapped to each packet. As described herein, such distribution of placeholder bits 410 throughout the packets allows the device to determine the balancing pattern for the codeword 425 during a read process that follows the write process. Additionally, the mapping may comply with constraints imposed by the distance of the error correction code (e.g., Hamming matrix 401). For example, the bits may be mapped to packets in a manner that ensures that the dimension of each packet is greater than or equal to the distance of the error correction code.

Thus, strategic mapping of the bits in a codeword to packets may allow the device to balance the codeword without invalidating the codeword. In the context of FIG. 4A, it is the strategic mapping of the bits in the codeword 425 to Packet 1 and Packet 2 that allows the device to balance the codeword 425 without invalidating the codeword 425.

After balancing the codeword 425 in a manner that maintains its validity, the device may complete the write process by storing the entire codeword 425 in memory. Because the entire codeword 425 is stored in memory, the device may determine the balancing information for the codeword 425 by determining, for each packet, whether the placeholder bit mapped to that packet has been inverted. The device may be able to determine that a placeholder bit has been inverted if the logic value for the placeholder bit is different than the original logic value (e.g., the predetermined logic value used to generate the codeword 425). For example, if the placeholder bits 410 used to generate the codeword 425 were all logic '0's, the device may determine that any placeholder bit that is now a logic '1' (such as s1') has been inverted. Accordingly, the device may identify the packets that were inverted during the balancing process (e.g., Packet 1) and un-invert those packets. Thus, the device may determine the balancing pattern for the codeword 425 based on the placeholder bits 410 stored in memory.

As an additional note, it should be appreciated that in some examples the device may append one or more padding bits 430 to the codeword 425 so that the codeword 425 becomes perfectly balanced or assumes a fixed weight. For example if the balancing process results in unequal quantities of logic '1's and logic '0's (e.g., three logic '1's and four logic '0's), the device may append one or more padding bits (pa) to the codeword 425 so that the codeword has equal quantities of logic '1's and logic '0's. The padding bits 430 may be stored along with the data bits 405 and the parity bits 420 so that a more perfectly tuned dynamic reference sensing scheme can be used during a subsequent read process.

Figure 4B:
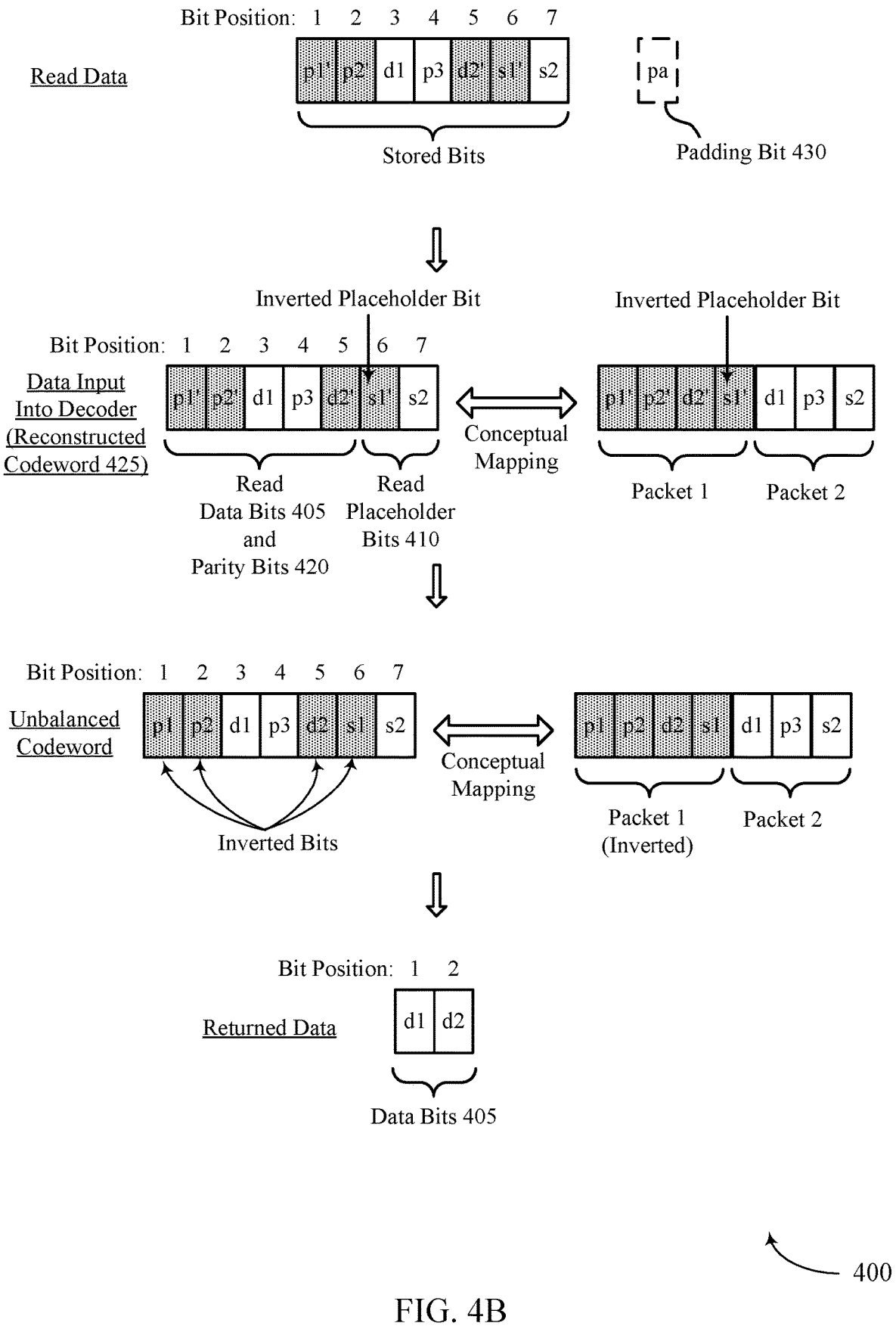
FIG. 4B illustrates an example of bits during a read process that supports generating a balanced codeword protected by an error correction code in accordance with examples as disclosed herein.

FIG. 4B illustrates an example of bits 400 that support generating a balanced codeword protected by an error correction code in accordance with examples as disclosed herein. The bits 400 illustrate various arrangements of bits (e.g., data bits 405, placeholder bits 410, parity bits 420, padding bits 430) at different stages of a read process for a set of data using the first technique described herein. The read process may occur after a write process as described with reference to FIG. 4A. Thus, the read process may involve the codeword 425, which is both balanced and protected by an error correction code.

As noted, in the first technique the entire codeword 425 may be stored in memory during a write process. When a read command is received for the data bits 405, the device may read the codeword 425 from memory. For example, the device may read the stored data bits 405, the stored placeholder bits 410, and the stored parity bits 420 from the memory. If one or more padding bits 430 were stored with the codeword 425, the device may also read the one or more padding bits 430.

In some examples, the device use a dynamic reference sensing scheme to read the stored data bits 405, the stored placeholder bits 410, the stored parity bits 420, and the stored padding bit(s) 430. The dynamic reference sensing scheme may mitigate issues of drift as described herein. The device may be able use the dynamic reference sensing scheme because the data being read (e.g., the stored codeword 425 plus, possibly, the padding bit(s) 430) is quasi-balanced or perfectly balanced. Given that the padding bit(s) 430 are for balancing purposes only, it should be appreciated that the padding bit(s) 430 can be discarded after the appropriate reference voltage is determined (and thus may not be input into, or considered by, the decoder). However, if desired, the padding bit(s) 430 may in some examples be protected by the error correction code, in which case the padding bit(s) 430 would also be input into the decoder.

Using the stored data bits 405, the stored placeholder bits 410, and the stored parity bits 420, the device may reconstruct the codeword 425. The device may then determine whether any of the placeholder bits 410 have been inverted by comparing the logic value of each placeholder bits to the predetermined logic value used for that placeholder bit during the construction of the original codeword 425. If a placeholder bits 410 has been inverted (e.g., if the placeholder bit is a logic '1' rather than a logic '0'), the device may determine that the packet to which the placeholder bits 410 is mapped has been inverted (e.g., during a pre-storage balancing process). Accordingly, the device may invert the appropriate packets to recover the original logic values of the codeword 425. In the example illustrated in FIG. 4B, the device may determine that placeholder bit s1 is inverted and, in response, invert Packet 1. Thus, the codeword 425 may be restored to its unbalanced form. The device may then input the unbalanced codeword 425 into a decoder associated with the Hamming matrix 401 to decode the codeword 425. If the decoder detects an error in the codeword 425, the device may correct that error and prepare to return the data bits 405 to the requesting device. Although described with the unbalancing process occurring before the decoding process, the order of these processes can be flipped, as later described herein, so that the decoding process occurs before the unbalancing process.

Once the codeword 425 has been unbalanced, the device may return the data bits 405 to the device that transmitted the read command, thereby concluding the read process for the codeword 425.

Figure 5A:
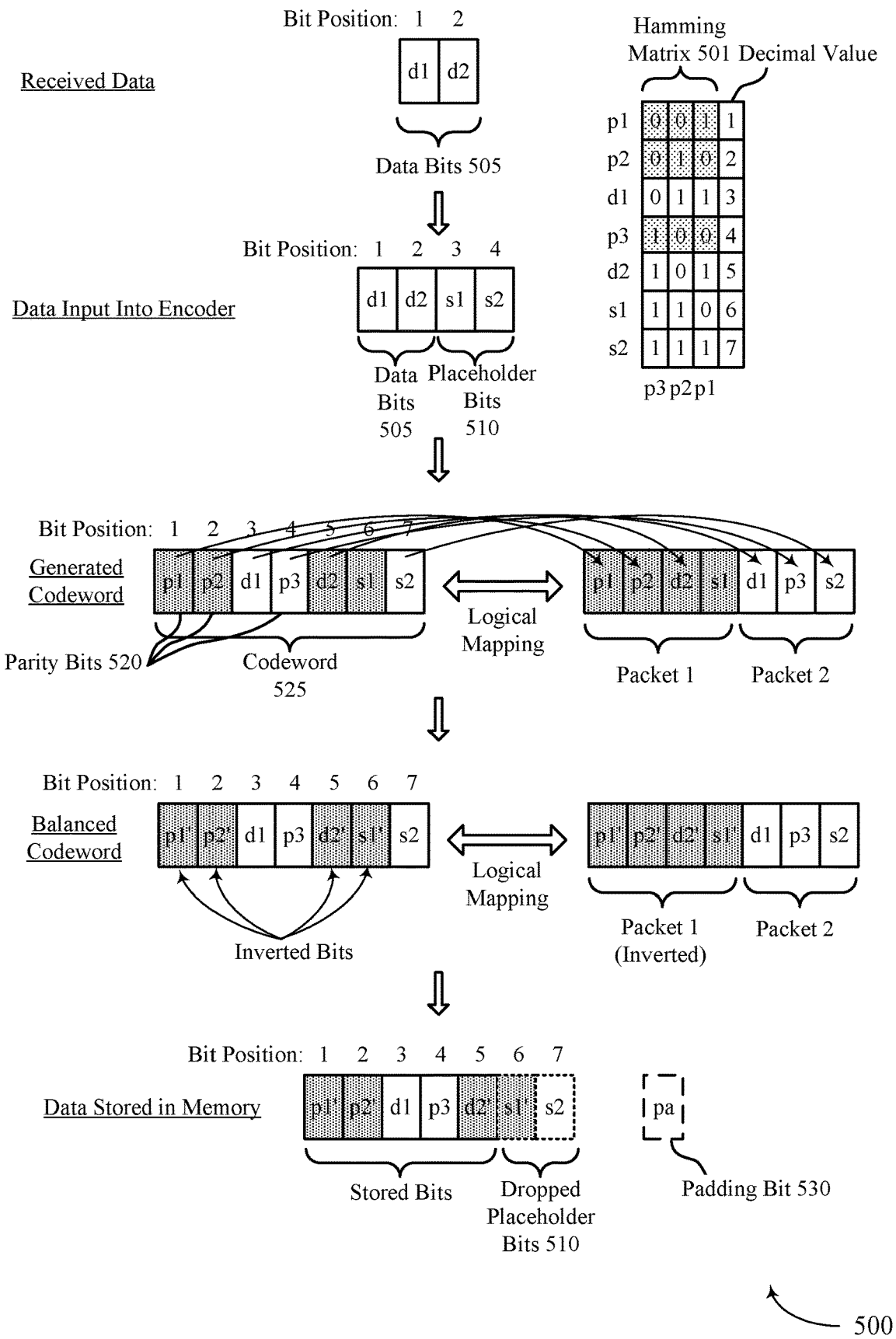
FIG. 5A illustrates an example of bits during a write process that supports generating a balanced codeword protected by an error correction code in accordance with examples as disclosed herein.

FIG. 5A illustrates an example of bits 500 that support generating a balanced codeword protected by an error correction code in accordance with examples as disclosed herein. The bits 500 illustrate various arrangements of bits (e.g., data bits 505, placeholder bits 510, parity bits 520, padding bits 530) at different stages of a write process for a set of data using the second technique described herein. Thus, the write process may involve storing the data bits 505, the parity bits 520, and optionally the padding bits 530, but not the placeholder bits 510. So, compared to the write process described with reference to FIG. 4A, the write process described with reference to FIG. 5A may reduce the quantity of memory cells used to store a codeword, which may increase the efficiency of the device. As discussed herein, the write process may generate for the set of data a codeword 525 that is both balanced and protected by an error correction code.

To generate the codeword 525, a device may use a matrix such as Hamming matrix 501. For ease of illustration the described Hamming matrix 501 is an example of ECC1 (e.g., an error correction code only capable detecting and correcting a single error). However, it should be appreciated that the techniques described herein may involve at least ECC2 (e.g., an error correction code that is capable of detecting two errors). By using ECC2, a device that detects one error in the codeword 525 (e.g., an intentionally inserted error in the placeholder bits 510) to determine the balancing information bits can still detect and correct another error (e.g., an unintentionally inserted error) in the other bits of the codeword. Additionally, use of a more complex matrix may allow the memory device to implement a mapping scheme for the second technique as described with reference to FIG. 3. In the same vein, it should be appreciated that the techniques described herein can be implemented using any appropriate quantities of data bits, parity bits, and placeholder bits. Thus, the given example is provided for ease of illustration alone and is not limiting in any way.

The write process may include a device receiving data bits 505 and an associated write command that indicates the device is to store the data bits 505 in memory. The data bits 505 may include a first data bit (d1) in a first position and a second data bit (d2) in a second position. Thus, in the given example, there may be two data bits 505 that the device is to store in memory. But, as noted, the techniques described herein can be implemented for any quantity of data bits 505. For example, to accommodate a different quantity of data bits, a different Hamming matrix may be used.

After receiving the data bits 505, the device may add the placeholder bits 510, which may enable to device to determine balancing information for the codeword 525 in a subsequent read operation. In some examples, the placeholder bits 510 may be referred to as balancing information bits (because they are used to indicate the balancing pattern for the codeword 425), flag bits (because they are used to indicate packets inverted during a subsequent balancing process), or other suitable terminology. The placeholder bits 510 may include a first placeholder bit (s1) and a second placeholder bit (s2). The quantity of placeholder bits 510 added to the data bits 505 may be equal to the quantity of packets to which the codeword 525 is mapped (e.g., so that each packet can include a respective placeholder bit 510). The logic values of the placeholder bits 510 may be predetermined (e.g., independent of the logic values of the data bits 505). For example, the placeholder bits 510 may have logic values of logic '0' regardless of the logic values of the data bits 505.

In some examples, adding the placeholder bits 510 to the data bits 505 may involve inputting the placeholder bits 510 and the data bits 505 into an encoder or generating the placeholder bits 510 at the encoder. Thus, the data operated on by the encoder may include the data bits 505 and the placeholder bits 510. In some examples, the placeholder bits 510 bits may take the place of shortened bits that would otherwise be dropped. For instance, the placeholder bits 510 may be input into, or generated by, components of the encoder that would otherwise be unused (e.g., because the encoder is designed to protect a greater quantity of bits than the data bits 505). As noted, the placeholder bits 510 may be set to a predetermined logic value (e.g., logic '0'), which may facilitate determination of the balancing pattern for the codeword 525 during a read process that follows the write process. Because the placeholder bits 510 are set to predetermined logic values, the placeholder bits 510 operated on by the encoder may be internally generated by the encoder (e.g., by considering certain inputs as logic '0's) or input into the encoder from memory cells or a voltage reference hardwired or otherwise permanently coupled with the encoder.

The encoder may use the data bits 505 and the placeholder bits 510 to generate the parity bits 520 (and thus the codeword 525). For example, the encoder may apply the Hamming matrix 501 so that various combinations of the data bits 505 and placeholder bits 510 are XOR'd to create the parity bits 520. As explained above and illustrated in FIG. 5A, each row of the Hamming matrix 501 may be associated with a different bit of the codeword 525. Additionally, each parity bit may be associated with a respective column of the Hamming matrix 501. Thus, the encoder may generate the parity bits 520 by XORing the data bits 505 and/or the placeholder bits 510 indicated by the column associated with that parity bit.

Upon generating the parity bits, the device may generate the codeword 525 by positioning each bit as indicated by the Hamming matrix 501. Thus, the first parity bit (p1), the second parity bit (p2) and the first data bit (d1) may be in the first, second, and third positions, respectively, of the codeword 525. And so on and so forth as illustrated. Thus, in the given example, the codeword 525 may include seven bits in seven positions. However, the second technique described herein can be implemented for codewords of any dimension.

According to the techniques described herein, each bit in the codeword 525 may be mapped to a packet. For example, the following bits may be mapped to Packet 1: the first parity bit (p1), the second parity bit (p2), the second data bit (d2), and the first placeholder bit (s1). And the following bits may be mapped to Packet 2: the first data bit (d1), the third parity bit (p3), and the second placeholder bit (s2). The bits mapped to a packet may be collections of bits that, when inverted together, maintain the validity of the codeword 525. However, it should be appreciated that because the validity of the balanced codeword 525 has been maintained, the decoder is still able to detect an error that is inserted in the balanced codeword 525 after the balancing process. As described herein, such an error may indicate the balancing pattern used on the codeword 525 if the error occurs in one of the placeholder bits 510.

Although described with reference to a single mapping, it should be appreciated that different mappings of the codeword 525 may be used to test different balancing patterns. As noted, the different mappings may be implemented using a more complex matrix than Hamming matrix 501.

After balancing the codeword 525 in a manner that maintains its validity, the device may complete the write process by storing a subset of the balanced codeword 525 in memory. For example, the device may store the data bits 505 and the parity bits 520, but not the placeholder bits 510, in memory. Rather than store the placeholder bits 510, the device may drop, discard, or otherwise ignore the placeholder bits 510 so that the quantity of memory cells used to store the codeword 525 is reduced relative to other techniques (such as the first technique). When the device uses this storage technique, the device may modify its decoding process to determine the balancing pattern for the codeword 525. For example, rather than decoding the entire codeword 525 (which the device cannot do, because the placeholder bits 510 were not stored), the device may decode a version of the codeword 525 that has predetermined bits in the place of the placeholder bits 510. This process is described in more detail herein and with respect to FIG. 5B.

As noted with respect to FIG. 4A, it should be appreciated that in some examples the device may append one or more padding bits 530 to the codeword 525 so that the codeword 525 becomes perfectly balanced or assumes a fixed weight. The padding bits 530 may be stored along with the data bits 505 and the parity bits 520 so that a more perfectly tuned dynamic reference sensing scheme can be used during a subsequent read process.

Figure 5B:
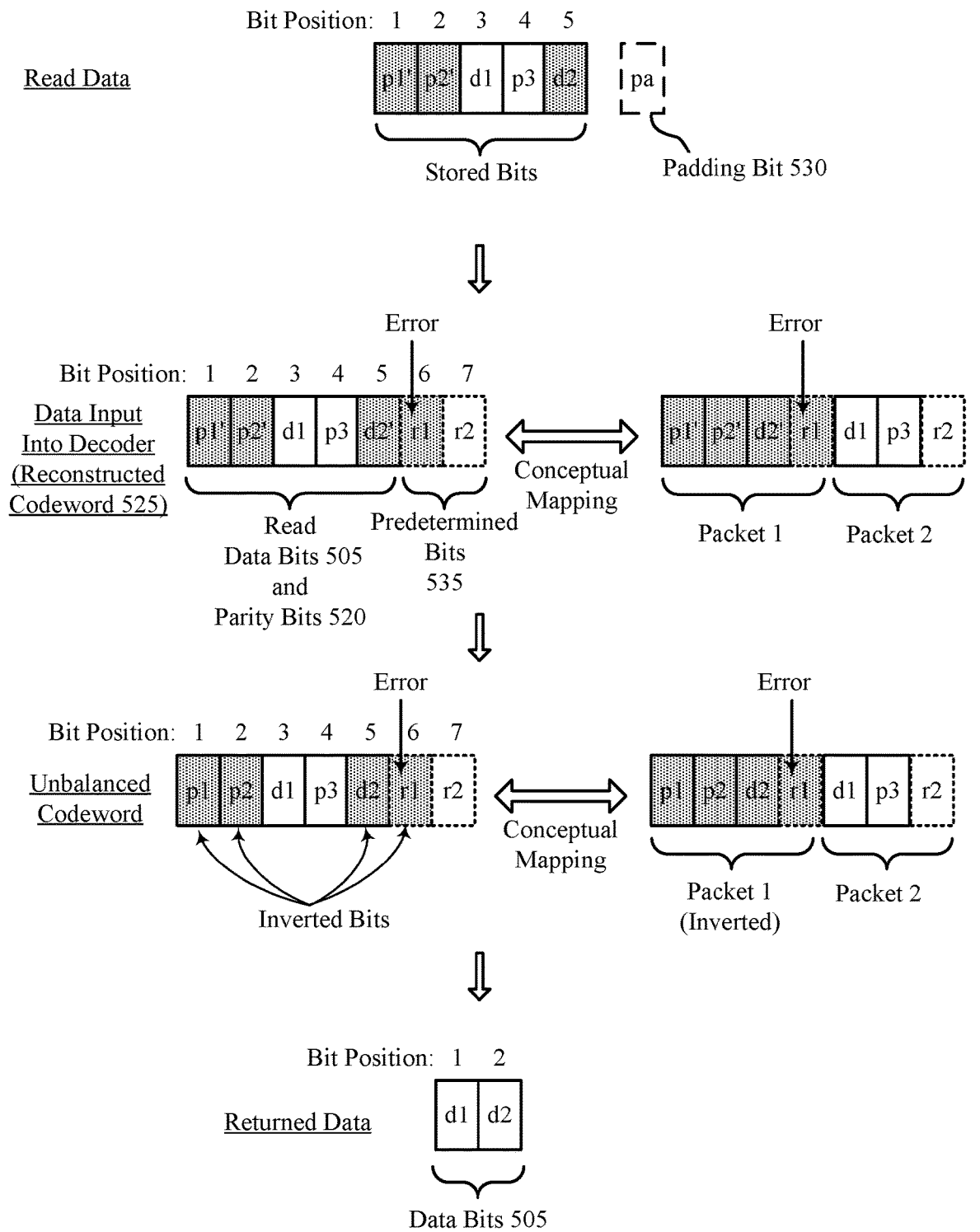
FIG. 5B illustrates an example of bits during a read process that supports generating a balanced codeword protected by an error correction code in accordance with examples as disclosed herein.

FIG. 5B illustrates an example of bits 500 that support generating a balanced codeword protected by an error correction code in accordance with examples as disclosed herein. The bits 500 illustrate various arrangements of bits (e.g., data bits 505, placeholder bits 510, parity bits 520, padding bits 530) at different stages of a read process for a set of data using the second technique described herein. The read process may occur after a write process described in FIG. 5A. Thus, the read process may involve the codeword 525, which is both balanced and protected by an error correction code.

As noted, in some examples, only a subset of the codeword 525 may be stored in memory. When a read command is received for the data bits 505, the device may read the stored subset of the codeword 525 from memory. For example, the device may read the stored data bits 505 and the stored parity bits 520 from the memory. If one or more padding bits 530 were stored with the codeword 525, the device may also read the one or more padding bits 530. In some examples, the device use a dynamic reference sensing scheme to read the stored data bits 505, the stored parity bits 520, and the stored padding bit(s) 530. The dynamic reference sensing scheme may mitigate reliability issues of drift as described herein. The device may be able use the dynamic reference sensing scheme because the data being read (e.g., the subset of the stored codeword 525 plus, possibly, the padding bit(s) 530) is quasi-balanced or perfectly balanced. Given that the padding bit(s) 530 are for balancing purposes only, it should be appreciated that the padding bit(s) 530 can be discarded after the appropriate reference voltage is determined (and thus may not be input into the decoder).

Using the stored data bits 505 and the stored parity bits 520, the device may reconstruct a version of the codeword 525 that includes predetermined bits 535 in the positions previously occupied by the placeholder bits 510. For example, the device may insert a first predetermined bit (r1) in the sixth position (previously occupied by placeholder bit s1) and a second predetermined bit (r2) in the seventh position (previously occupied by placeholder bit s2). Thus, the predetermined bits 535 may appear (from the perspective of the decoder, which expects the placeholder bits 510) to be the placeholder bits 510. However, the logic values of the predetermined bits 535 may be strategically chosen so that the decoder detects an error in the last packet (index-wise) that was inverted during the balancing process described with reference to FIG. 5A. For example, the predetermined bits 535 may be assigned the same logic values as the placeholder bits 510 used to construct the codeword 525. Predetermined bits 535 may also be referred to a virtual bits, replacement balancing information bits, preset bits, default bits, preconfigured bits, or other suitable terminology.

As an illustration, the predetermined bits 535 may all be assigned logic values of logic '0.' However, when the codeword 525 was stored, the bit in the sixth position (s1) had a logic value of logic '1' because the Packet 1 was inverted during the balancing process. Thus, the device may flag the bit in the sixth position (e.g., the first placeholder bit (r1)) as an error because it has an unexpected logic value (e.g., a logic value of logic '1' rather than logic '0'). The device is able to detect this error because the validity of the codeword 525 was maintained during the balancing process, meaning that the decoder is able to detect a subsequent insertion of an error (which arises as a consequence of decoding the first predetermined bit (r1) instead of the first placeholder bit (s1)).

By interpreting the predetermined bits 535 as balancing information bits coded using One Hot Coding, the device may determine the balancing pattern used for codeword 525. For example, the device may interpret the error in predetermined bits 535 as the logic '1' in the balancing bits, and thus the error may indicate that Packet 1 was the last packet (index-wise) inverted during the balancing process. Accordingly, the device may unbalance the codeword 525 by inverting the data bits mapped to Packet 1 (e.g., p1, p2, d2, r1). Thus, the device may obtain the unbalanced version of the codeword 525.

Once the codeword 525 has been unbalanced, the device may return the data bits 405 to the device that transmitted the read command, thereby concluding the read process for the codeword 525.

Although described separately, the first technique described with reference to FIGS. 4A and 4B and the second technique described with reference to FIGS. 5A and 5B may be used in combination. For example, consider a scenario in which x Hot Coding is used for the balancing information bits (e.g., x Hot Coding scheme is used to indicate the balancing pattern). In such a scenario, it may take x of the balancing information bits to indicate the last packet (index-wise) inverted during a balancing process. Accordingly, the device may store a subset of the balancing information bits (e.g., as placeholder bits) in memory and discard the remaining balancing information bits. To reconstruct the codeword during a subsequent read and decoder process, the device may use the stored subset of the balancing information bits and a set of predetermined bits in place of the discarded balancing information bits. By detecting an inversion in the stored balancing information bits (e.g., similar to the first technique) and an error in the predetermined set of bits (e.g., similar to the second technique), the device may determine the balancing information for the codeword. Compared to the first technique, such combination of techniques may require fewer memory cells to store the codeword; compared to the second technique, such combination of techniques may require a lower power error correction code.

FIG. 6 illustrates an example of a process flow 600 that supports generating a balanced codeword protected by an error correction code in accordance with examples as disclosed herein. The process flow 600 may be implemented by a device so that the device can generate, and use, a codeword that is both balanced and protected by an error correction code. Accordingly, the process flow 600 may include a storage process 601 and a retrieval process 602, which may be examples of the write process and read process for the first technique described herein and with respect to FIGS. 4A and 4B, respectively. During the storage process 601, the device may construct, balance, and store a codeword. During the retrieval process 602, the device may reconstruct and unbalance the codeword.

Alternative examples of the process flow 600 may be implemented in which some operations are performed in a different order than described or are not performed at all. In some examples, the process flow 600 may include operations not mentioned below (e.g., additional operations may be added). Additionally, some operations may be performed in parallel (e.g., concurrently, or during overlapping times).

At 605, the device may receive data bits and a write command associated with the data bits. At 610, the device may construct a codeword based on the data bits and placeholder bits (e.g., balancing information bits set to logic '0's). For instance, the device may generate a codeword that includes data bits, placeholder bits, and parity bits. The parity bits may be generated based on the user data bits, the placeholder bits, and a matrix (e.g., a Hamming matrix) for the codeword as described herein and with reference to FIG. 4A. The bits of the codeword (e.g., the data bits, placeholder bits, parity bits) may be strategically mapped to packets as described herein and with reference to FIG. 4A. Mapping a bit to a packet may refer to a logical or conceptual relationship and does not necessarily involve physically arranging the bits into packets. The mapping of bits to packets may be preconfigured at the device or determined by the device on the fly.

At 615, the device may determine a balancing pattern for the codeword as described herein and with reference to FIG. 3. The balancing pattern may indicate the packets of the codeword that are to be inverted to achieve a desired balance (e.g., a desired ratio of logic values). At 620, the device may balance the codeword according to the determined balancing pattern. Balancing the codeword may involve inverting one or more packets of the codeword, which may be accomplished by inverting the bits mapped to the one or more packets. If the codeword is already balanced, the device may skip balancing the codeword at 620.

At 625, the device may store the balanced codeword in memory. For example, the balanced codeword may be stored in a set of memory cells associated with the codeword. In some cases, the device may also store padding bits (e.g., additional bits set to logic '1's) so that the stored codeword is perfectly balanced or has a target fixed weight. If the device stores padding bits, the padding bits may be stored in the set of memory cells associated with the codeword. That way, the padding bits will be read in addition to the bits of the codeword during the retrieval process 602, which may improve use of a dynamic reference sensing scheme. Storing one or more padding bits along with a codeword may be referred to as appending the padding bits to the codeword.

At 630, the device may read the stored codeword from the set of memory cells associated with the codeword. The device may read the stored codeword in response to a read command for the data bits. If padding bits were stored at 625, the device may also read the padding bits from the set of memory cells associated with the codeword. Reading the stored codeword, and, in some cases, the stored padding bits, may involve using a dynamic reference sensing scheme to sense the set of memory cells associated with the codeword. For example, the device may iteratively increase the magnitude of the reference voltage (or reference current) used to sense the memory cells until the ratio of logic values associated with the read data matches the ratio of logic values associated with the codeword.

At 635, the device may reconstruct the codeword using the stored data bits, the stored parity bits, and the stored placeholder bits read from the set of memory cells at 630. In some cases, constructing the codeword may refer to inputting the stored data bits, the stored parity bits, and the stored placeholder bits into a decoder (e.g., from latches coupled with set of memory cells associated with the codeword). Because the padding bits were stored for balancing purposes alone (e.g., to improve the accuracy of the dynamic reference sensing scheme), the device may refrain from using the padding bits to reconstruct the codeword.

At 640, the device may decode the reconstructed codeword. If any one or more errors are detected in the codeword, the device may correct them. At 645, the device may determine whether any of placeholder bits are inverted relative to the original (e.g., predetermined) logic values of the placeholder bits.

If, at 645, the device determines that none of the placeholder bits are inverted, the device may determine that no packets were inverted during the balancing process at 620. Accordingly, the device may refrain from inverting any packets of the reconstructed codeword before returning the data at 650 to the requesting device that transmitted the read command.

If, at 645 the device determines that the one or more placeholder bits are inverted, the device may use the inverted placeholder bits to determine, at 655, the balancing pattern for the codeword. For example, the device may determine that each packet associated with an inverted placeholder bit was inverted during the balancing process at 620. Accordingly, the device may, at 660, unbalance the reconstructed codeword by inverting the indicated packet(s) so that the reconstructed codeword matches the codeword constructed at 610. Thus, the device may effectively obtain the original logical values of the data bits received at 605. At 665, the device may return (e.g., communicate, transfer) the data bits to the requesting device.

FIG. 7 illustrates an example of a process flow 700 that supports generating a balanced codeword protected by an error correction code in accordance with examples as disclosed herein. The process flow 700 may be implemented by a device so that the device can generate, and use, a codeword that is both balanced and protected by an error correction code. Accordingly, the process flow 700 may include a storage process 701 and a retrieval process 702, which may be examples of the write process and read process for the second technique described herein and with respect to FIGS. 5A and 5B, respectively. During the storage process 701, the device may construct, balance, and store a codeword. During the retrieval process 702, the device may reconstruct and unbalance the codeword.

Alternative examples of the process flow 700 may be implemented in which some operations are performed in a different order than described or are not performed at all. In some examples, the process flow 700 may include operations not mentioned below (e.g., additional operations may be added). Additionally, some operations may be performed in parallel (e.g., concurrently, or during overlapping times).

At 705, the device may receive data bits and a write command associated with the data bits. At 710, the device may construct a codeword based on the data bits and placeholder bits (e.g., balancing information bits set to logic '0's). For instance, the device may generate a codeword that includes data bits, placeholder bits, and parity bits. The parity bits may be generated based on the user data bits, the placeholder bits, and a matrix (e.g., a Hamming matrix) for the codeword as described herein and with reference to FIGS. 4A and 5A. The bits of the codeword (e.g., the data bits, placeholder bits, parity bits) may be strategically mapped to packets as described herein and with reference to FIGS. 4A and 5A.

At 715, the device may determine a balancing pattern for the codeword as described herein and with reference to FIG. 3. The balancing pattern may indicate the packets of the codeword that are to be inverted to achieve a desired balance (e.g., a desired ratio of logic values). At 720, the device may balance the codeword according to the determined balancing pattern. Balancing the codeword may involve inverting one or more packets of the codeword, which may be accomplished by inverting the bits mapped to the one or more packets. If the codeword is already balanced, the device may skip balancing the codeword at 720.

At 725, the device may store the data bits and parity bits of the balanced codeword. The device may also drop or discard the placeholder bits. Thus, the device may store a subset of the codeword. The data bits and parity bits may be stored in a set of memory cells associated with the codeword. In some cases, the device may also store padding bits (e.g., additional bits set to logic '1's) so that the stored codeword is perfectly balanced or has a target fixed weight. If the device stores padding bits, the padding bits may be stored in the set of memory cells associated with the codeword. That way, the padding bits will be read in addition to the data bits and the parity bits during the retrieval process 702, which may improve use of a dynamic reference sensing scheme.

At 730, the device may read the stored data bits and the stored parity bits from the set of memory cells associated with the codeword. The device may read the stored data bits and the stored parity bits in response to a read command for the data bits. If padding bits were stored at 725, the device may also read the padding bits from the set of memory cells associated with the codeword. Reading the stored data bits, the stored parity bits, and, in some cases, the stored padding bits may involve using a dynamic reference sensing scheme to sense the set of memory cells associated with the codeword. For example, the device may iteratively increase the magnitude of the reference voltage (or reference current) used to sense the memory cells until the ratio of logic values associated with the read data matches the ratio of logic values associated with the codeword.

At 735, the device may reconstruct the codeword using the stored data bits and the stored parity bits read from the set of memory cells at 730. The stored data bits and the stored parity bits may be positioned in the codeword in the same positions as the data bits and the parity bits in the codeword constructed at 710. That is, the stored data bits and stored parity bits may assume the positions they previously occupied in the codeword. Because the placeholder bits were dropped at 725, the device may use predetermined bits in place of the placeholder bits. For example, the device may position the predetermined bits in the codeword so that the predetermined bits occupy the positions previously occupied by the placeholder bits. In some cases, constructing the codeword may refer to inputting the stored data bits, the stored parity bits, and the predetermined bits into a decoder. The predetermined bits may be received from memory cells or a voltage reference permanently coupled with the decoder. Alternatively, the encoder may be configured to internally generate the predetermined bits. Because the padding bits were stored for balancing purposes alone (e.g., to improve the accuracy of the dynamic reference sensing scheme), the device may refrain from using the padding bits to reconstruct the codeword.

At 740, the device may decode the reconstructed codeword. At 745, the device may determine, based on the decoding, whether the reconstructed codeword has an error in the predetermined set of bits.

If, at 745, the device determines that the reconstructed codeword does not have an error in the predetermined set of bits (e.g., the predetermined set of bits is error-free), the device may determine that no packets were inverted during the balancing process at 720. Accordingly, the device may refrain from inverting any packets of the reconstructed codeword before returning the data at 750 to the requesting device that transmitted the read command. In some examples, the device may detect and correct one or more errors in the reconstructed codeword before returning the data to the requesting device. For example, the device may detect and correct one or more errors in the stored data bits or the stored parity bits.

If, at 745 the device determines that the reconstructed codeword does have an error in the predetermined set of bits, the device may interpret the predetermined set of bits as balancing information bits to determine, at 755, the balancing pattern for the codeword. For example, the device may determine that the error in the predetermined bits represents the logical '1' in balancing bits that are One Hot Coded. Thus, the location of the error may indicate the last packet (index-wise) inverted during the balancing process at 720. Accordingly, the device may, at 760, unbalance the reconstructed codeword by inverting the indicated packet and all preceding packets (index-wise) so that the reconstructed codeword matches the codeword constructed at 710. Thus, the device may effectively obtain the original logical values of the data bits received at 705. At 765, the device may return (e.g., communicate, transfer) the data bits to the requesting device.

According to the present disclosure, a method may be implemented by a device or a system, so that information bits are encoded/decoded and the information therein is stored/retrieved without any of the information bits being stored in memory cells. In some cases, information bits may comprise balancing bits, flag bits or other bits associated to data bits. The process (not depicted in a specific drawing) may be implemented by a device so that the device can generate, and use, a codeword that is protected by an error correction code. Accordingly, the process flow may include a storage process and a retrieval process (respectively similar to storage 701 and retrieval 702 processes), which may be examples of write process and read process similar to those of the second technique described herein and with respect to FIGS. 5A and 5B, respectively (however, data bits may not be present, in some embodiments). During the storage process, the device may construct and store a codeword comprising parity bits associated to the information bits, as described below. During the retrieval process, the device may reconstruct the information bits based on the reading process of the parity bits/codeword.

Alternative examples of the method may be implemented in which some operations are performed in a different order than described or are not performed at all. In some examples, the method may include operations not mentioned below (e.g., additional operations may be added). Additionally, some operations may be performed in parallel (e.g., concurrently, or during overlapping times). Additionally or alternatively, only portions of the method may be performed; for example, information bits may be encoded only, or information bits may be reconstructed only.

A method is described for encoding/decoding information bits; the method may comprise associating predetermined value bits to the information bits. The information bits are representative of an information to be encoded and/or decoded; the information bits may be received at an input of a device, may be computed (e.g., internally computed) based on other operations being performed, and/or they may be decoded and used or output by the device. Predetermined value bits may be bits with a logic "0" value, bits with a logic "1" value, or bits with a combination of logic "0" and logic "1" values.

The method may further comprise computing and storing parity bits based, at least in part, on the information bits and the predetermined value bits. Computing parity bits may be performed according to an internal, e.g., embedded, or an external engine for error correction code (ECC). The ECC may determine parity bits based on a difference between a pattern of the information bits and a pattern of the predetermined value bits. Similarly to the description referring to FIG. 5 and as further described below, information bits may be representative of information encoded according to a One Hot Coding (or, more generally, to a x Hot Coding) scheme. Accordingly, the ECC engine and the corresponding parity bits may need to have one bit (or, more generally, x bits) error correction capability dedicated to information bits. Storing parity bits may comprise writing, e.g., programming, the parity bits in memory cells, e.g., volatile or non-volatile memory cells, of a memory device. It should be noted that, according to some embodiments, storing the parity bits is exclusive of storing the predetermined value bits or the information bits; in other words, the information bits are not stored in memory cells of the memory array and the predetermined bits are not stored in memory cells of the memory array, resulting, at least in some cases, in a better and more efficient usage of memory.

The method may further comprise retrieving parity bits and reconstructing the information bits based on the parity bits and the predetermined value bits. Retrieving parity bits may comprise reading the parity bits previously programmed. It should be noted that retrieving the parity bits is exclusive of retrieving either the information bits or the predetermined value bits (neither of which was store during the programming). Reconstructing the information bits may be performed based on the ECC engine; the ECC engine may be implemented in hardware or software or a combination thereof. Predetermined value bits are provided in input to the ECC engine either as hardwired to corresponding reference voltages (e.g., voltages representative of logic "0" and/or logic "1" in the predetermined pattern), or anyway as a constant logic predetermined pattern. The ECC engine may evaluate consistency of the parity bits with the predetermined value bits (and other data bits possibly stored and encoded with the information bits) and determine any intentional error with respect to the predetermined value bits in order to reconstruct the information bits.

Accordingly, the method may comprise encoding and, respectively, decoding the information bits based on computing parity bits (e.g., using the ECC engine as explained above) and storing them (e.g., programming into the memory array) and, respectively, retrieving parity bits (e.g., reading from the memory cells) and reconstructing the information bits (e.g., using the ECC engine to reconstruct the correct information). As mentioned above, the method comprises storing and retrieving the parity bits exclusive of storing and retrieving the predetermined value bits. In other words, only the parity bits (and possibly other data bits the information bits may be associated to and encoded/decoded in conjunction with) are programmed into and read from the memory cells. The pattern of the predetermined value bits may be hardwired or anyway be constant, therefore saving memory array space.

In some embodiments, the method encoding/decoding comprises encoding/decoding according to a One Hot Coding scheme or, more generally, according to a x Hot Coding scheme, as described above, also with reference to FIGS. 3 through 5.

In some embodiments of the method, the parity bits are configured to correct at least x intentional errors in the information bits encoded/decoded according to the x Hot Coding with respect to the predetermined value bits. In other words, the ECC engine correcting capability may be reserved to correct intentional errors, or differences of the information bits with respect to the predetermined value bits. For example, assuming that the predetermined value bit pattern is all "0" and if a One Hot Coding scheme is adopted for the information bits, at most one of the information bits may be a logic "1" and the ECC engine must be capable of correcting at least one bit with respect to a hardwired all "0" pattern. In case the ECC engine is used to correct errors in codeword also including possible data, the one error correction capability reserved for the information bit is deduced from the total error correction capability of the ECC engine. Similarly, if a x Hot Coding scheme is adopted (e.g., up to x bits in the information bits pattern may differ from the predetermined value bits pattern) a correction capability of x bits in the ECC engine is reserved.

In some embodiments of the method, the information bits comprise balancing information bits, flag bits, or other bits associated to data bits, and computing the parity bits and/or the reconstructing the information bits is also based on the data bits. For example, it may be desirable to program a balanced, or quasi balanced, codeword in the memory; portions of the data may be inverted and corresponding information (e.g., whether and which portions have been inverted or flipped, or balancing information in short) may be necessary to reconstruct in response to a data read operation command. In such embodiments, the balancing information bits may correspond to the information bits and may be encoded/decoded according to the method in conjunction with data bits, for example.

In some embodiments the method comprises computing the parity bits and reconstructing the information are based on hardwired predetermined value bits. For example, the predetermined value bits are set to predetermined logic values, the predetermined value bits operated on by the ECC engine may be internally generated by the ECC engine (e.g., by considering certain inputs as logic '0's) or input into the ECC engine from memory cells or a voltage reference hardwired or otherwise permanently coupled with the ECC engine; if the ECC engine is implemented in software, a constant pattern for the predetermined value bits may be used.

According to the method, in other words, information bits (in some cases adopting a x Hot Coding scheme) may be encoded and/or decoded, e.g., stored and retrieved, using parity bits associated at least to the information bits without directly storing the information bits nor associated predetermined value bits.

Figure 8:
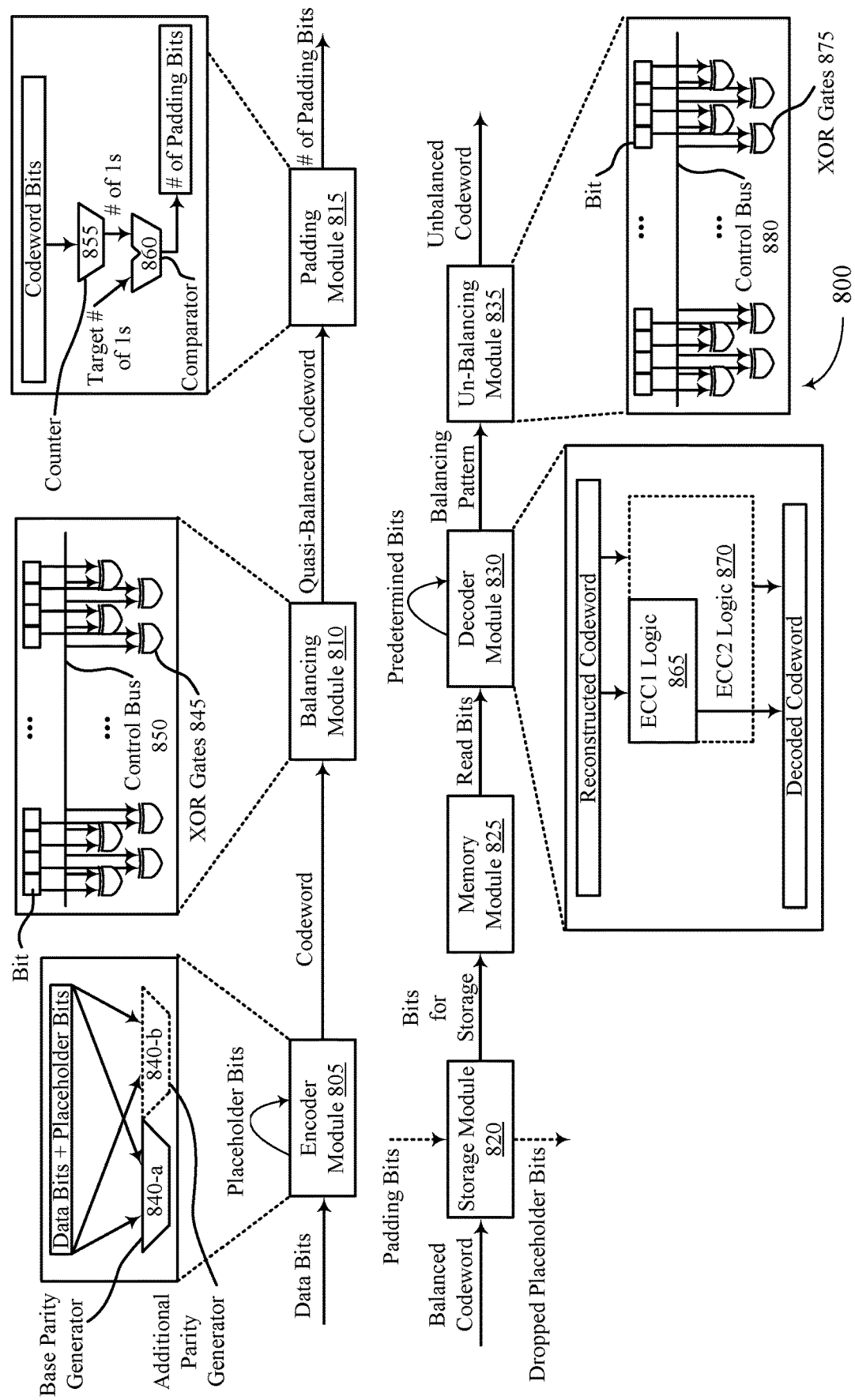
FIG. 8 illustrates an example of components that support generating a balanced codeword protected by an error correction code in accordance with examples as disclosed herein.

FIG. 8 illustrates an example of components 800 that support generating a balanced codeword protected by an error correction code in accordance with examples as disclosed herein. The components 800 may be included in a device so that the device can generate, and use, a codeword that is both balanced and protected by an error correction code. Although particular sub-components, logic components, devices, circuits, etc., are included in the components 800, the techniques described herein can be implemented using a variety of components not limited to those described herein. The components 800 may include an encoder module 805, a balancing module 810, a padding module 815, a storage module 820, a memory module 825, a decoder module 830, and an un-balancing module 835, and these components may be coupled with each other via various buses and channels. In some examples, the components 800 are controlled by one or more controllers or processors.

The components 800 may be used to implement the first technique described herein, the second technique described herein, or a combination of the first technique and the second technique. Although described and shown separately, some components may be combined or coupled in manners not illustrated in FIG. 8. Additionally, it should be appreciated that the components 800 are not necessarily limited to the functions described herein, and that one or more functions performed by a component may be split between that component and another component or performed by another component altogether. Thus, the described components 800 and associated functions are for illustrative purposes only and do not limit the scope of the techniques described herein.

The encoder module 805 may generate a codeword for data bits that are to be stored in memory. For example, the encoder module 805 may generate parity bits, and a corresponding codeword, based on the data bits and additional placeholder bits. The data bits may be received (e.g., over a data bus) from another component of the device. The placeholder bits may also be received from other components of the device (e.g., from memory cells or voltage references coupled—possibly permanently—with the encoder module 805), or the placeholder bits may be internally generated by the encoder module 805. For example, the encoder module 805 may be configured to consider the placeholder bits as default logic values, which may allow the encoder module 805 to be optimized by omitting logic components associated with the placeholder bits. As noted herein, the logic values of the placeholder bits may be predetermined logic values that are independent of the logic values of the data bits. In some examples, each placeholder bit of the placeholder bits has a logic value of logic '0.'

In some examples, the encoder module 805 may include a one or more parity generators 840. A parity generator 840 may be a logic circuit configured to generate parity bits based on a set of bits, such as data bits and placeholder bits. In some cases, a single parity generator such as the base parity generator 840-$a$ may be used to implement the first technique described herein. However, at least two parity generators 840 (e.g., the base parity generator 840-$a$ and the additional parity generator 840-$b$) may be used to implement the second technique described herein. Using two parity generators 840 may increase the power of the error correction code used to protect the codeword output by the encoder module 805, which in turn may allow the decoder module 830 to detect multiple errors in the codeword (e.g., one intentional error in placeholder bits, which is used to determine the balancing pattern, and one unintentional error in the rest of the codeword). Of course, higher powers of error correction codes may be used in both the first technique and the second technique to increase the amount of errors that can be detected and corrected.

The balancing module 810 may balance a codeword output from the encoder module 805. For example, the balancing module 810 may invert a set of bits of the codeword. The bits of the codeword may be mapped to one or more packets as described herein. Thus, the balancing module 810 may perform a balancing process on the codeword by inverting one or more packets of the codeword. The balancing process may produce a quasi-balanced codeword that is output by the balancing module 810.

In some examples, the balancing module 810 may include one or more counters, similar to the counter 855, so that the balancing module 810 can calculate the weight of the codeword after each packet inversion. The balancing module 810 may also include one or more comparators (e.g., two comparators similar to the comparator 860) so that the balancing module 810 can determine whether the amount of bits with logic values of logic '1' is within the target range.

In some examples, the balancing module 810 may include logic gates such as XOR gates 845. In some cases, each XOR gate 845 may invert a single respective bit of a codeword. Thus, there may be one XOR gate 845 per bit of a codeword. The XOR gates 845 may receive respective bits of a codeword in parallel. Additionally, the XOR gates 845 may receive control signals that enable the XOR gates 845. For example, the XOR gate may invert a bit of a codeword when the control signal is a logic '1;' otherwise, the bit may pass through the XOR gate 845 un-inverted. The same control signal may be used for all the XOR gates 845 associated with a packet, and each control signal may be based on the balancing pattern determined for the codeword. The bits of the codeword and the respective controls signals may be received at the XOR gates 845 in parallel, which may allow the XOR gates 845 to invert (as appropriate) the respective bits in parallel.

In other cases, each XOR gate 845 may invert the bits mapped to a respective packet of the codeword. Thus, there may be one XOR gate per packet, and an XOR gate may receive (e.g., serially) all the bits mapped to a packet. As noted, an XOR gate may also receive a control signal that enables the XOR gate. For example, the XOR gate may invert the bits of a packet when the control signal is a logic '1;' otherwise, the bits of the packet may pass through the XOR gate un-inverted. The control signal input into an XOR 845 gate may be associated with the packet for that XOR gate 845 and may be based on the balancing pattern determined for the codeword. In some examples, the control signal input into an XOR gate 845 may be communicated over a control bus 850.

The padding module 815 may generate padding bits that, when appended to a quasi-balanced codeword output by the balancing module 810, perfectly balance the codeword or give it a target fixed weight. The padding module 815 may determine the quantity of padding bits to be generated based on the ratio of logic '1's to logic '0's in the balanced codeword received from the balancing module 810. Thus, the padding module 815 may receive the bits of a codeword and output an indication of the quantity of padding bits to be appended to the codeword. In some examples, the padding module 815 may also generate and output the padding bits.

In some examples, the padding module 815 may include a counter 855 and a comparator 860. The counter 855 may be a logic circuit configured to count the quantity of bits in a codeword that are logic '1's. The comparator 860 may be a logic circuit configured to compare the quantity of bits that are logic '1's to a target quantity of logic '1's. The target quantity of logic '1's may be based on the dimension of the codeword and a desired type of balancing. In some examples, the padding module 815 may use thermometrical coding to indicate the desired amount of padding bits.

The storage module 820 may prepare for storage a balanced codeword output by the balancing module 810. In some examples, the storage module 820 may also prepare a quantity of padding bits for storage (e.g., so that the codeword is perfectly balanced or has a fixed weight). If the first technique is being implemented, the storage module 820 may prepare the entire codeword for storage. If second technique is being implemented, the storage module 820 may prepare a subset of the codeword for storage by dropping the placeholder bits. Thus, the storage module 820 may output bits for storage, and these bits may be the bits of an entire codeword or the bits of a subset of a codeword.

The memory module 825 may write (to a memory) bits received from the storage module 820. The bits may be written to a set of memory cells associated with the codeword so that the bits are stored in the set of memory cells. If the first technique is being implemented, the memory module 825 may store the entire codeword, plus possibly padding bits, in the set of memory cells. If second technique is being implemented, the memory module 825 may store a subset of the codeword (e.g., the data bits, the parity bits, and possibly padding bits) in the set of memory cells. Because the placeholder bits are discarded in the second technique, the quantity (e.g., amount) of memory cells used to store the codeword may be less in the second technique than in the first technique.

The memory module 825 may read the set of memory cells when a read command for the data bits is received. If the first technique is being implemented, the memory module 825 may read the entire codeword, plus any associated padding bits, from the set of memory cells. If the second technique is being implemented, the memory module 825 may read the subset of the codeword (e.g., the data bits, the parity bits, and any associated padding bits) from the set of memory cells. Regardless of the technique used, the memory module 825 may read the set of memory cells using a dynamic reference sensing scheme, which may be possible because the stored codeword has a known balance or weight. Once the memory module 825 has read the set of memory cells using the appropriate reference voltage (as determined via the dynamic reference sensing scheme), the memory module 825 may output the associated bits to the decoder module 830. In some examples, the bits may be relayed from the memory module 825 via latches coupled with the memory module 825 and the decoder module 830.

The decoder module 830 may decode the bits received from the memory module 825. If the first technique is being used, the decoder module 830 may receive the bits of the entire codeword from the memory module 825, reconstruct the codeword from the bits, and decode the reconstructed codeword. In doing so, the decoder module 830 may detect and correct one or more errors in the reconstructed codeword. The decoder module 830 may also determine which placeholder bits, if any, are inverted relative to their original predetermined logic values. The decoder module 830 may determine which packets, if any, were inverted by the balancing module 810 based on the inversion status of the placeholder bit mapped to each packet. Thus, the decoder module 830 may effectively determine the balancing pattern for the codeword using the first technique.

If the second technique is being used, the decoder module 830 may receive a subset of the codeword (e.g., the data bits and the parity bits) from the memory module 825. Because the placeholder bits are missing, the decoder module 830 may use predetermined bits in place of the placeholder bits to reconstruct the codeword for decoding. In some examples, the predetermined bits may be received from other components of the device. For example, the predetermined bits may be received from memory cells or a voltage reference (e.g., ground, VCC) coupled with the decoder module 830. In some cases, the voltage reference may be permanently coupled with the decoder module 830 (e.g., the voltage reference may be shorted or hard-wired to the decoder module 830 via a conductive trace with no intervening components). In some examples, the predetermined bits may be internally generated by the decoder module 830, or the decoder module 830 may be configured to consider the predetermined bits as default logic values. Thus, the decoder module 830 may be optimized by omitting logic components associated with the predetermined bits.

When the second technique is being used, the decoder module 830 may detect an error in the predetermined bits during a decoding process performed on the reconstructed codeword. As described herein, the location of the error in the predetermined bits may indicate the last packet (index-wise) inverted by the balancing module 810. Thus, the decoder module 830 may effectively determine the balancing pattern for the codeword using the second technique. In some examples, the decoder module 830 may also detect and correct one or more errors in the data bits and/or parity bits of the codeword.

The decoder module 830 may include logic circuitry that operates on a reconstructed codeword and that outputs a decoded version of the reconstructed codeword. For example, the decoder module 830 include ECC1 logic 865, which may be a logic circuit configured to detect a single error in a reconstructed codeword by applying an error correction code to the reconstructed codeword. When the first technique is used, the decoder module 830 may include at least the ECC1 logic 865, which may be used to detect unintentional errors in a reconstructed codeword.

In some examples, the decoder module 830 may include ECC2 logic 870, which may additional logic circuitry that allows the decoder module 830 to detect a multiple errors in the reconstructed codeword. When the second technique is used, the decoder module 830 may include at least the ECC2 logic 870 (but not the ECC1 logic 865) so that the decoder module 830 can detect an intentional error in the reconstructed codeword—which allows the device to determine the balancing pattern for the codeword—and an unintentional error in the reconstructed codeword. However, the decoder module 830 is not limited to the components shown and may include additional error correction code logic circuitry that allows the decoder module 830 to detect and correct additional errors.

In some examples, the encoder module 805 and the decoder module 830 are associated with the same error correction code (e.g., the encoder module 805 and the decoder module 830 may be associated with the same Hamming matrix).

The un-balancing module 835 may unbalanced a codeword according to a balancing pattern for the codeword indicated by the decoder module 830. In some examples, the indication of the balancing pattern may be in the form of balancing information bits. The un-balancing module 835 may unbalance (or "de-balance") the codeword by inverting the bits of packets indicated by the balancing pattern. Thus, the un-balancing module 835 may output an unbalanced version of the codeword, which may be identical to the codeword output by the encoder module 805.

In some examples, the un-balancing module 835 may include one or more counters, similar to the counter 855, so that the un-balancing module 835 can calculate the weight of the codeword after each packet inversion. The un-balancing module 835 may also include one or more comparators (e.g., two comparators similar to the comparator 860) so that the un-balancing module 835 can determine whether the amount of bits with logic values of logic '1' is within the target range.

In some examples, the un-balancing module 835 may include logic gates such as XOR gates 875. In some cases, each XOR gate 875 may invert a single respective bit of a codeword. Thus, there may be one XOR gate 875 per bit of a codeword. The XOR gates 875 may receive respective bits of a codeword in parallel. Additionally, the XOR gates 875 may receive control signals that enable the XOR gates 875. For example, an XOR gate 875 may invert a bit of a codeword when the control signal is a logic '1,' otherwise, the bit may pass through the XOR gate 875 un-inverted. The same control signal may be used for all the XOR gates 875 associated with a packet, and each control signal may be based on the balancing pattern determined for the codeword. The bits of the codeword and the respective controls signals may be received at the XOR gates 875 in parallel, which may allow the XOR gates 875 to invert (as appropriate) the respective bits in parallel.

In other cases, each XOR gate 875 may invert the bits mapped to a respective packet of the codeword. Thus, there may be one XOR gate per packet, and an XOR gate may receive (e.g., serially) all the bits mapped to a packet. As noted, an XOR gate may also receive a control signal that enables the XOR gate. For example, the XOR gate 875 may invert the bits of a packet when the control signal is a logic '1;' otherwise, the bits of the packet may pass through the XOR gate 875 un-inverted. The control signal input into an XOR gate 875 may be associated with the packet for that XOR gate 875 and may be based on the balancing pattern for the codeword. In some examples, the control signal input into an XOR gate 875 may be communicated over a control bus 880.

Thus, the components 800 may be used to generate and use a balanced codeword protected by an error correction code.

Figure 9:
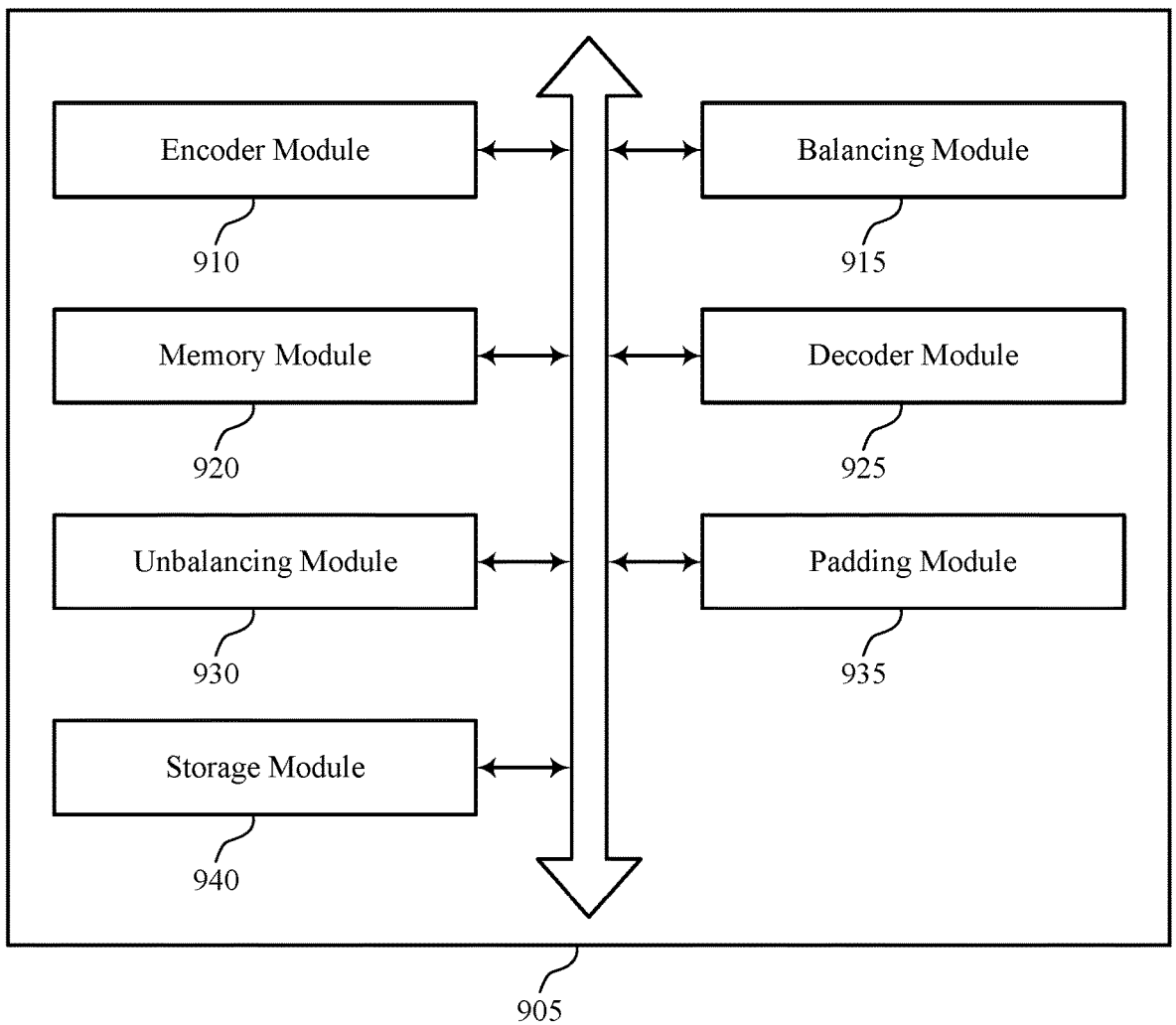
FIG. 9 shows a block diagram of a memory device that supports generating a balanced codeword protected by an error correction code in accordance with examples as disclosed herein.

FIG. 9 shows a block diagram 900 of a memory device 905 that supports generating a balanced codeword protected by an error correction code in accordance with examples as disclosed herein. The memory device 905 may be an example of aspects of a memory device as described with reference to FIGS. 3-8. The memory device 905 may include an encoder module 910, a balancing module 915, a memory module 920, a decoder module 925, an unbalancing module 930, a padding module 935, and a storage module 940. Each of these modules may communicate, directly or indirectly, with one another (e.g., via one or more buses).

In a first example (e.g., of the first technique or a combination of the first technique and the second technique), the encoder module 910 may generate a codeword of bits including data bits, placeholder bits, and parity bits, where the bits of the codeword are mapped to packets. The balancing module 915 may invert one or more packets of the codeword to modify a ratio of logic values associated with the codeword, where each packet of the codeword includes a respective placeholder bit mapped to that packet. The memory module 920 may store the data bits, the parity bits, and at least a portion of the placeholder bits in a memory. The decoder module 925 may reconstruct the codeword based at least in part on the stored data bits, the stored parity bits, and the stored portion of the placeholder bits. The unbalancing module 930 may invert the one or more packets based at least in part on a logic value of the placeholder bit mapped that packet.

In some examples (e.g., of the first technique), storing the portion of the placeholder bits includes storing all the placeholder bits. In some examples, the unbalancing module 930 may determine, for each of the one or more packets, that the logic value of the placeholder bit mapped to that packet is different than an expected logic value for that placeholder bit, where the one or more packets are in inverted based at least in part on the determination. In some examples, the expected logic value for each placeholder bit is a logic value of that placeholder bit before the first inversion of the one or more packets.

In some examples (e.g., of a combination of the first technique and the second technique), the portion of the placeholder bits excludes a remainder of the placeholder bits. In some examples, the decoder module 925 may use a set of bits in place of the remainder of the placeholder bits to reconstruct the codeword; and determine an error in the set of bits based at least in part on a decoding process performed on the reconstructed codeword, where the one or more packets are inverted based at least in part on the error in the set of bits.

In a second example (e.g., of the second technique), the encoder module 910 may generate a codeword of bits including data bits, placeholder bits, and parity bits, where the bits of the codeword are mapped to packets. The balancing module 915 may invert one or more packets of the codeword to modify a ratio of logic values associated with the codeword, wherein a validity of the codeword is maintained after inverting the one or more packets. The memory module 920 may store a portion of the codeword in a set of memory cells, the portion of the codeword including the data bits and the parity bits and excluding the placeholder bits. The decoder module 925 may decode the codeword based at least in part on the parity bits stored in the set of memory cells, the data bits stored in the set of memory cells, and a set of bits in place of the placeholder bits, where each bit of the set of bits is associated with a respective packet of the packets. In some examples, each bit of the set of bits has a logic value of zero. The unbalancing module 930 may invert the one or more packets based at least in part on an error in the set of bits detected by decoding the codeword.

In some examples, the padding module 935 may append a second set of bits to the codeword based at least in part on the ratio of logic values associated with the codeword after inverting the one or more packets, where appending the second set of bits further modifies the ratio of logic values associated with the codeword. In some examples, the memory module 920 may store the second set of bits to in the set of memory cells along with the data bits and the parity bits.

In some examples, the memory module 920 may select a reference voltage based at least in part on the ratio of logic values associated with the codeword after inverting the one or more packets; and sense the set of memory cells based at least in part on the reference voltage.

In some examples, the placeholder bits occupy a plurality of positions in the codeword. In some examples, the padding module 935 may add the set of bits to the codeword, where the set of bits occupy the plurality of positions previously occupied by the placeholder bits.

In some examples, the encoder module 910 may receive the data bits and a write command. In some examples, the encoder module 910 may input the data bits and the placeholder bits into an encoder associated with a matrix that enables detection of multiple errors, where the parity bits are output by the encoder. In some examples, the bits of the codeword are mapped to the packets based at least in part on the matrix associated with the encoder, and where the matrix is associated with a decoder used to decode the codeword. In some examples, the packets comprise a quantity of bits greater than or equal to a distance of the matrix.

In some examples, the packets are sequentially indexed. In some examples, the unbalancing module 930 may determine that the one or more packets were inverted based at least in part on a coding scheme associated with the set of bits, where the error detected in the set of bits indicates the last packet, index-wise, of the one or more packets that were inverted.

In some examples, the decoder module 925 may decode the codeword by inputting the stored data bits, the stored parity bits, and the set of bits into a decoder that is configured to detect multiple errors. In some examples, the decoder module 925 may detect a second error in the stored data bits or the stored parity bits based at least in part on an output of the decoder.

In a third example (e.g., of the second technique), the encoder module 910 may construct a codeword of bits including data bits, placeholder bits, and parity bits. The balancing module 915 may invert a plurality of the bits of the codeword to modify a ratio of logic values associated with the codeword. The memory module 920 may store the data bits and the parity bits in a set of memory cells after inverting the plurality of bits. The decoder module 925 may perform a decoding process on the stored data bits, the stored parity bits, and a set of bits that represent the placeholder bits. The unbalancing module 930 may invert the plurality of bits that were inverted based at least in part on the decoding process detecting an error in the set of bits.

In some examples, the storage module 940 may discarding the placeholder bits after the plurality of bits have been inverted. In some examples, the decoder module 925 may reconstruct the codeword based at least in part on the stored data bits, the stored parity bits, and the set of bits, where the decoding process is performed on the reconstructed codeword and where the set of bits are positioned in the codeword as the placeholder bits.

In some examples, the unbalancing module 930 may associate each bit of the set of bits with a respective combination of the bits of the codeword, where a bit of the set of bits is associated with the plurality of bits; and determine that the plurality of bits were inverted based at least in part on the error in the set of bits including an error in the bit associated with the plurality of bits.

In some examples, the plurality of bits includes one or more packets of bits. In some examples, the balancing module 915 may invert the plurality of bits by inverting the one or more packets to reach a ratio of logic values, where each packet of the one or more packets includes a collection of bits that can be inverted without a decoding process detecting the inversion.

In some examples, the set of memory cells is associated with the codeword. In some examples, the padding module 935 may determine a second set of bits based at least in part on the modified ratio of logic values associated with the codeword. In some examples, the memory module 920 may store, along with the data bits and the parity bits, the second set of bits in the set of memory cells associated with the codeword.

In some examples, the memory module 920 may receive a read command for the data bits after storing the data bits and the parity bits in the set of memory cells. In some examples, the memory module 920 may read, based at least in part on the read command, the data bits and the parity bits from the set of memory cells. In some examples, the decoder module 925 may input the data bits and the parity bits into a decoder as part of the decoding process. In some examples, the decoder module 925 may input the set of bits into the decoder, where the set of bits is transferred to the decoder from a voltage reference permanently coupled with the decoder. In other examples, the decoder module 925 may internally generate the set of bits. In some examples, the plurality of bits includes bits that, when inverted together, prevent the decoder from detecting the inversion In a fourth example (e.g., of the second technique), the balancing module 915 may invert a plurality of bits of a codeword that includes data bits, placeholder bits, and parity bits. The memory module 920 may store the codeword, excluding the placeholder bits, in memory after inverting the plurality of bits. The decoder module 925 may perform a decoding process on the stored data bits, the stored parity bits, and a set of bits in place of the placeholder bits. The unbalancing module 930 may the plurality of bits of the codeword based at least in part on an error detected in the set of bits during the decoding process.

In some examples, the encoder module 910 may construct the codeword, where the codeword includes the data bits in a first set of positions, the placeholder bits in a second set of positions, and the parity bits in a third set of positions. In some examples, the decoder module 925 may reconstruct the codeword, before performing the decoding process, where the reconstructed codeword includes the stored data bits in the first set of positions, the set of bits in the second set of positions, and the stored parity bits in the third set of positions.

In some examples, the encoder module 910 may input the data bits into an encoder to generate the codeword, where the encoder is configured with the placeholder bits as default logic values. In some examples, the decoder module 925 may input the stored data bits and the stored parity bits, into a decoder to perform the decoding process, where the decoder is configured with the set of bits as default logic values.

In some examples, the unbalancing module 930 may identifying which bit in the set of bits has the error, where the inverted plurality of bits includes one or more packets associated with the bit that has the error.

In some examples, the codeword is associated with a first ratio of logic values after inverting the plurality of bits. In some examples, the padding module 935 may append a second set of bits to the codeword before storing the codeword in the memory, where the codeword is associated with a second ratio of logic values after appending the second set of bits. In some examples, the memory module 920 may store the second set of bits in the memory along with the data bits and the parity bits.

In some examples, the memory module 920 may determine a reference voltage based at least in part on the second ratio of logic values associated with the codeword; and read the data bits, the parity bits, and the second set of bits from the memory based at least in part on the determined reference voltage.

Figure 10:
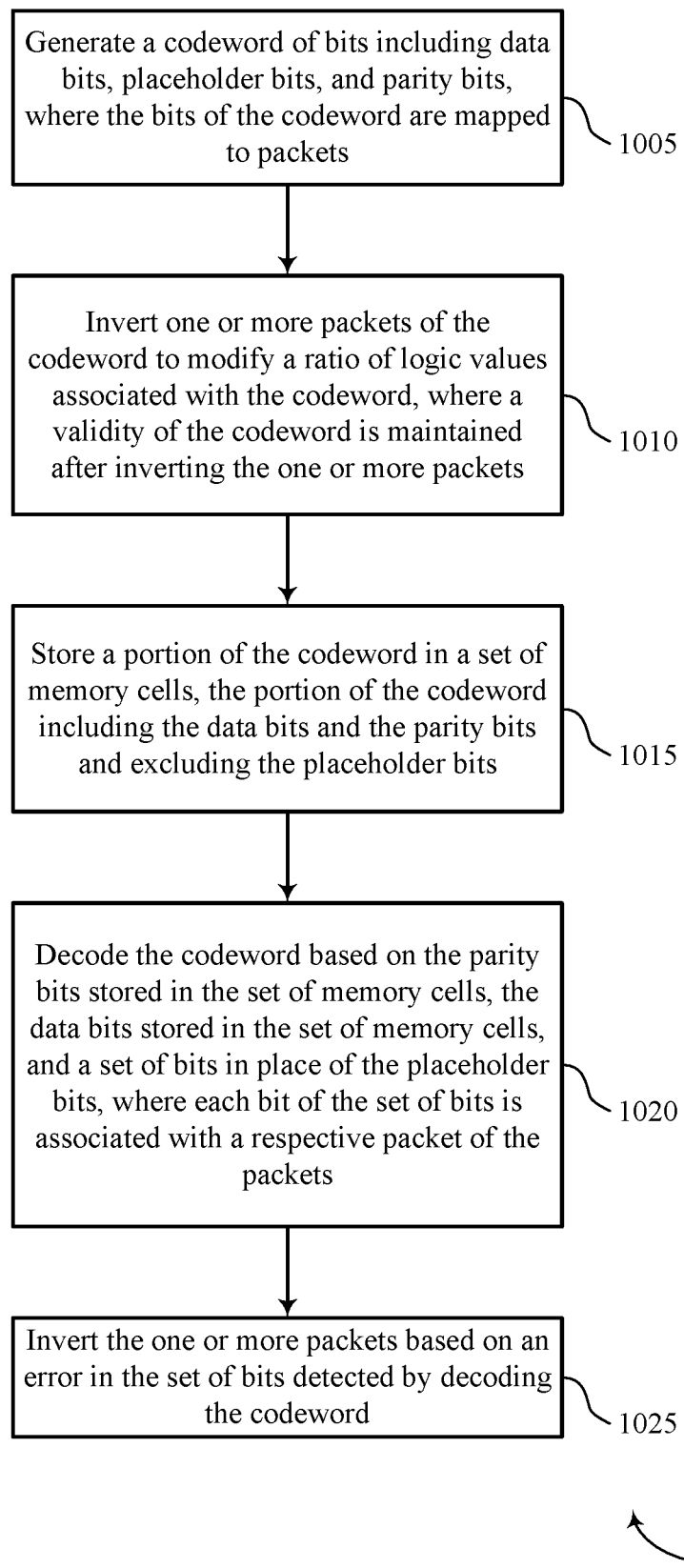
FIGS. 10 through 13 show flowcharts illustrating a method or methods that support generating a balanced codeword protected by an error correction code in accordance with examples as disclosed herein.

FIG. 10 shows a flowchart illustrating a method or methods 1000 that supports generating a balanced codeword protected by an error correction code in accordance with examples as disclosed herein. The operations of method 1000 may be implemented by a memory device or its components as described herein. For example, the operations of method 1000 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1005, the memory device may generate a codeword of bits including data bits, placeholder bits, and parity bits, where the bits of the codeword are mapped to packets. The operations of 1005 may be performed according to the methods described herein. In some examples, aspects of the operations of 1005 may be performed by an encoder module as described with reference to FIG. 9.

At 1010, the memory device may invert one or more packets of the codeword to modify a ratio of logic values associated with the codeword, where a validity of the codeword is maintained after inverting the one or more packets. The operations of 1010 may be performed according to the methods described herein. In some examples, aspects of the operations of 1010 may be performed by a balancing module as described with reference to FIG. 9.

At 1015, the memory device may store a portion of the codeword in a set of memory cells, the portion of the codeword including the data bits and the parity bits and excluding the placeholder bits. The operations of 1015 may be performed according to the methods described herein. In some examples, aspects of the operations of 1015 may be performed by a memory module as described with reference to FIG. 9.

At 1020, the memory device may decode the codeword based on the parity bits stored in the set of memory cells, the data bits stored in the set of memory cells, and a set of bits in place of the placeholder bits, where each bit of the set of bits is associated with a respective packet of the packets. The operations of 1020 may be performed according to the methods described herein. In some examples, aspects of the operations of 1020 may be performed by a decoder module as described with reference to FIG. 9.

At 1025, the memory device may invert the one or more packets based on an error in the set of bits detected by decoding the codeword. The operations of 1025 may be performed according to the methods described herein. In some examples, aspects of the operations of 1025 may be performed by an unbalancing module as described with reference to FIG. 9.

In some examples, an apparatus as described herein may perform a method or methods, such as the method 1000. The apparatus may include features, means, or instructions (e.g., a non-transitory computer-readable medium storing instructions executable by a processor) for generating a codeword of bits including data bits, placeholder bits, and parity bits, where the bits of the codeword are mapped to packets, inverting one or more packets of the codeword to modify a ratio of logic values associated with the codeword, where a validity of the codeword is maintained after inverting the one or more packets, storing a portion of the codeword in a set of memory cells, the portion of the codeword including the data bits and the parity bits and excluding the placeholder bits, decoding the codeword based on the parity bits stored in the set of memory cells, the data bits stored in the set of memory cells, and a set of bits in place of the placeholder bits, where each bit of the set of bits is associated with a respective packet of the packets, and inverting the one or more packets based on an error in the set of bits detected by decoding the codeword.

Some examples of the method 1000 and the apparatus described herein may further include operations, features, means, or instructions for appending a second set of bits to the codeword based on the ratio of logic values associated with the codeword after inverting the one or more packets, where appending the second set of bits further modifies the ratio of logic values associated with the codeword, and storing the second set of bits to in the set of memory cells along with the data bits and the parity bits.

Some examples of the method 1000 and the apparatus described herein may further include operations, features, means, or instructions for selecting a reference voltage based on the ratio of logic values associated with the codeword after inverting the one or more packets, and sensing the set of memory cells based on the reference voltage.

Some examples of the method 1000 and the apparatus described herein may further include operations, features, means, or instructions for adding the set of bits to the codeword, where the set of bits occupy the set of positions previously occupied by the placeholder bits.

Some examples of the method 1000 and the apparatus described herein may further include operations, features, means, or instructions for receiving the data bits and a write command, and inputting the data bits and the placeholder bits into an encoder associated with a matrix that enables detection of multiple errors, where the parity bits may be output by the encoder.

In some examples of the method 1000 and the apparatus described herein, the bits of the codeword may be mapped to the packets based on the matrix associated with the encoder, and where the matrix may be associated with a decoder used to decode the codeword.

In some examples of the method 1000 and the apparatus described herein, the packets include a quantity of bits greater than or equal to a distance of the matrix.

Some examples of the method 1000 and the apparatus described herein may further include operations, features, means, or instructions for determining that the one or more packets were inverted based on a coding scheme associated with the set of bits, where the error detected in the set of bits indicates the last packet, index-wise, of the one or more packets that were inverted.

In some examples of the method 1000 and the apparatus described herein, decoding the codeword may include operations, features, means, or instructions for inputting the stored data bits, the stored parity bits, and the set of bits into a decoder that may be configured to detect multiple errors, and detecting a second error in the stored data bits or the stored parity bits based on an output of the decoder.

In some examples of the method 1000 and the apparatus described herein, each bit of the set of bits may have a logic value of zero.

Figure 11:
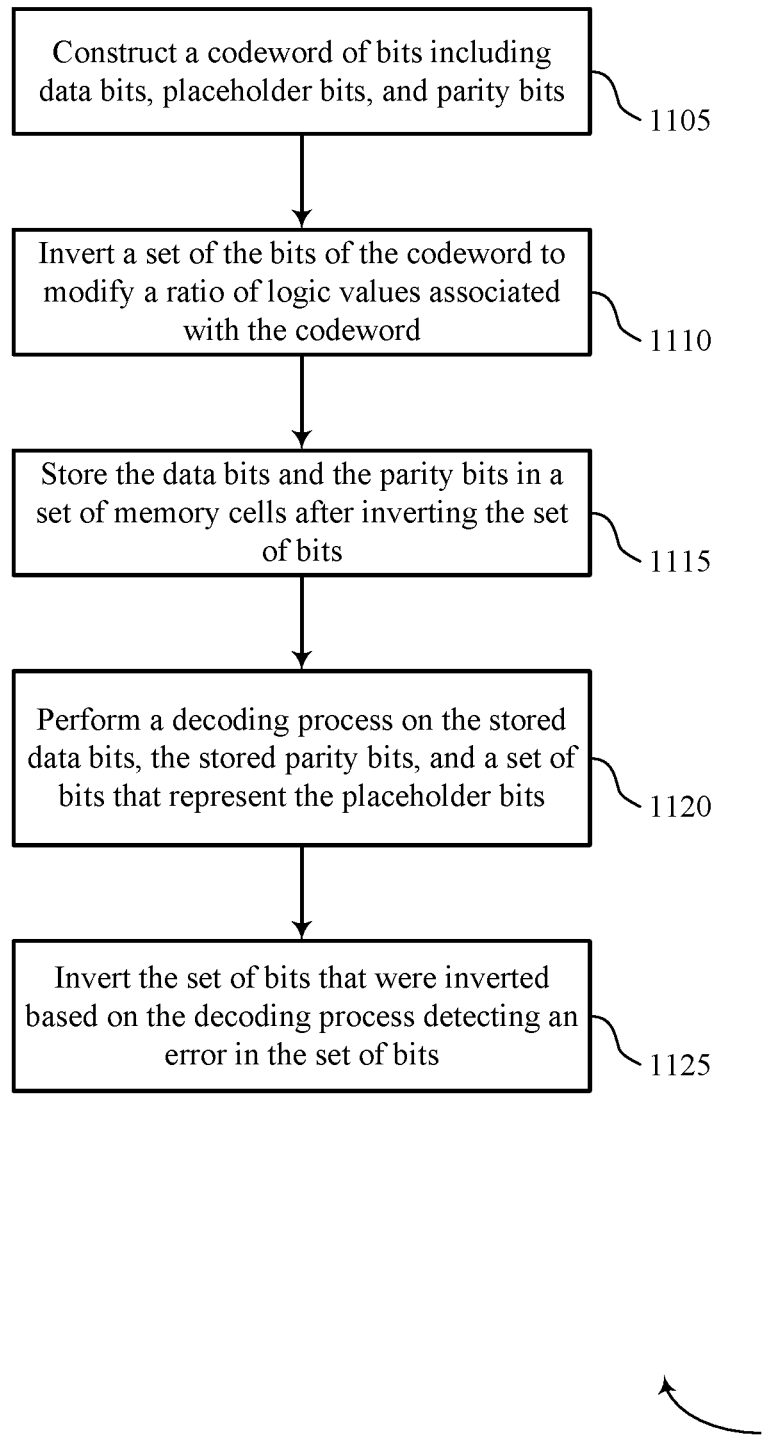

FIG. 11 shows a flowchart illustrating a method or methods 1100 that supports generating a balanced codeword protected by an error correction in accordance with examples as disclosed herein. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1105, the memory device may construct a codeword of bits including data bits, placeholder bits, and parity bits. The operations of 1105 may be performed according to the methods described herein. In some examples, aspects of the operations of 1105 may be performed by an encoder module as described with reference to FIG. 9.

At 1110, the memory device may invert a set of the bits of the codeword to modify a ratio of logic values associated with the codeword. The operations of 1110 may be performed according to the methods described herein. In some examples, aspects of the operations of 1110 may be performed by a balancing module as described with reference to FIG. 9.

At 1115, the memory device may store the data bits and the parity bits in a set of memory cells after inverting the set of bits. The operations of 1115 may be performed according to the methods described herein. In some examples, aspects of the operations of 1115 may be performed by a memory module as described with reference to FIG. 9.

At 1120, the memory device may perform a decoding process on the stored data bits, the stored parity bits, and a set of bits that represent the placeholder bits. The operations of 1120 may be performed according to the methods described herein. In some examples, aspects of the operations of 1120 may be performed by a decoder module as described with reference to FIG. 9.

At 1125, the memory device may invert the set of bits that were inverted based on the decoding process detecting an error in the set of bits. The operations of 1125 may be performed according to the methods described herein. In some examples, aspects of the operations of 1125 may be performed by an unbalancing module as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for constructing a codeword of bits including data bits, placeholder bits, and parity bits, inverting a set of the bits of the codeword to modify a ratio of logic values associated with the codeword, storing the data bits and the parity bits in a set of memory cells after inverting the set of bits, performing a decoding process on the stored data bits, the stored parity bits, and a set of bits that represent the placeholder bits, and inverting the set of bits that were inverted based on the decoding process detecting an error in the set of bits.

Some examples of the method 1100 and the apparatus described herein may further include operations, features, means, or instructions for discarding the placeholder bits after inverting the set of bits, and reconstructing the codeword based on the stored data bits, the stored parity bits, and the set of bits, where the decoding process may be performed on the reconstructed codeword and where the set of bits may be positioned in the codeword as the placeholder bits.

Some examples of the method 1100 and the apparatus described herein may further include operations, features, means, or instructions for associating each bit of the set of bits with a respective combination of the bits of the codeword, where a bit of the set of bits may be associated with the set of bits, and determining that the set of bits were inverted based on the error in the set of bits including an error in the bit associated with the set of bits.

In some examples of the method 1100 and the apparatus described herein, the set of bits may include operations, features, means, or instructions for inverting the one or more packets to reach a ratio of logic values, where each packet of the one or more packets includes a collection of bits that can be inverted without a decoding process detecting the inversion.

Some examples of the method 1100 and the apparatus described herein may further include operations, features, means, or instructions for determining a second set of bits based on the modified ratio of logic values associated with the codeword, and storing, along with the data bits and the parity bits, the second set of bits in the set of memory cells associated with the codeword.

Some examples of the method 1100 and the apparatus described herein may further include operations, features, means, or instructions for receiving a read command for the data bits after storing the data bits and the parity bits in the set of memory cells, reading, based on the read command, the data bits and the parity bits from the set of memory cells, and inputting the data bits and the parity bits into a decoder as part of the decoding process.

Some examples of the method 1100 and the apparatus described herein may further include operations, features, means, or instructions for inputting the set of bits into the decoder, where the set of bits may be transferred to the decoder from a voltage reference permanently coupled with the decoder.

In some examples of the method 1100 and the apparatus described herein, the set of bits includes bits that, when inverted together, prevent the decoder from detecting the inversion.

Figure 12:
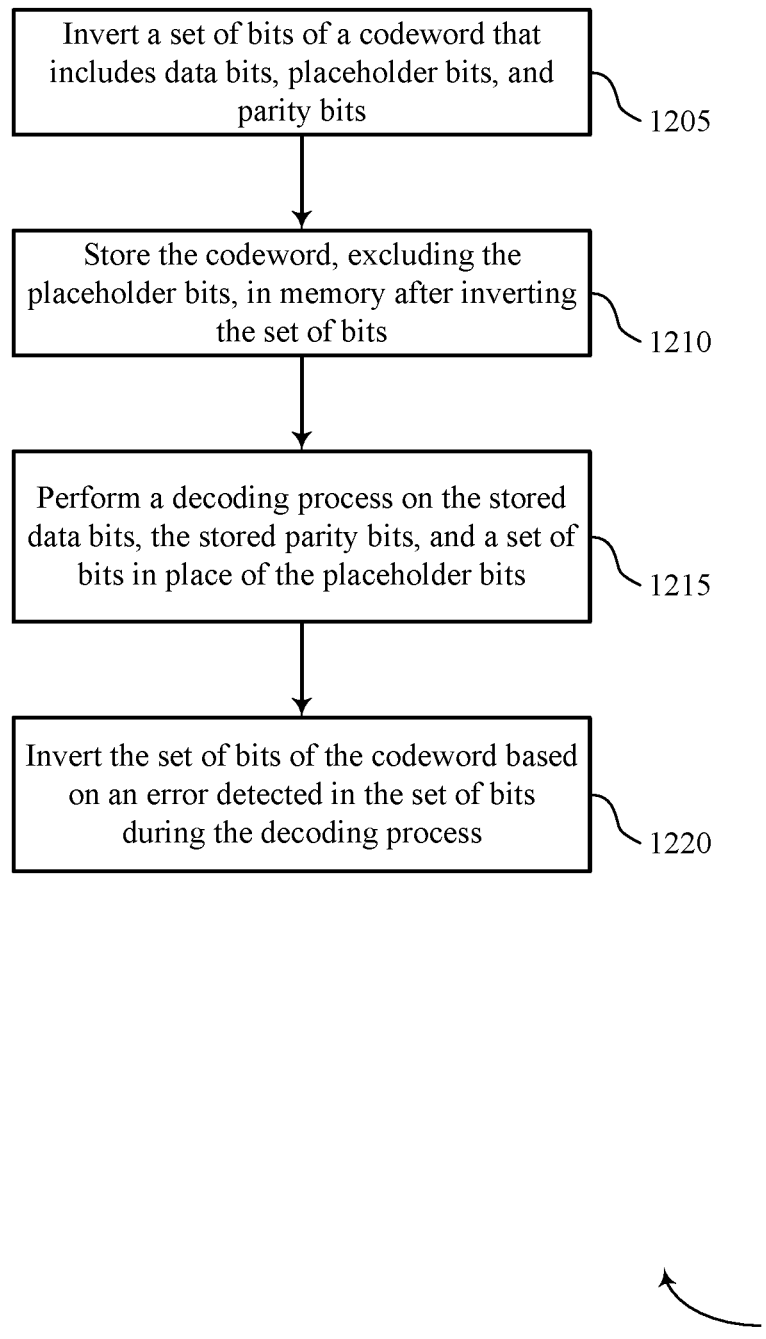

FIG. 12 shows a flowchart illustrating a method or methods 1200 that supports generating a balanced codeword protected by an error correction code in accordance with examples as disclosed herein. The operations of method 1200 may be implemented by a memory device or its components as described herein. For example, the operations of method 1200 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1205, the memory device may invert a set of bits of a codeword that includes data bits, placeholder bits, and parity bits. The operations of 1205 may be performed according to the methods described herein. In some examples, aspects of the operations of 1205 may be performed by a balancing module as described with reference to FIG. 9.

At 1210, the memory device may store the codeword, excluding the placeholder bits, in memory after inverting the set of bits. The operations of 1210 may be performed according to the methods described herein. In some examples, aspects of the operations of 1210 may be performed by a memory module as described with reference to FIG. 9.

At 1215, the memory device may perform a decoding process on the stored data bits, the stored parity bits, and a set of bits in place of the placeholder bits. The operations of 1215 may be performed according to the methods described herein. In some examples, aspects of the operations of 1215 may be performed by a decoder module as described with reference to FIG. 9.

At 1220, the memory device may invert the set of bits of the codeword based on an error detected in the set of bits during the decoding process. The operations of 1220 may be performed according to the methods described herein. In some examples, aspects of the operations of 1220 may be performed by an unbalancing module as described with reference to FIG. 9.

In some examples, an apparatus as described herein may perform a method or methods, such as the method 1200. The apparatus may include features, means, or instructions (e.g., a non-transitory computer-readable medium storing instructions executable by a processor) for inverting a set of bits of a codeword that includes data bits, placeholder bits, and parity bits, storing the codeword, excluding the placeholder bits, in memory after inverting the set of bits, performing a decoding process on the stored data bits, the stored parity bits, and a set of bits in place of the placeholder bits, and inverting the set of bits of the codeword based on an error detected in the set of bits during the decoding process.

Some examples of the method 1200 and the apparatus described herein may further include operations, features, means, or instructions for constructing the codeword, where the codeword includes the data bits in a first set of positions, the placeholder bits in a second set of positions, and the parity bits in a third set of positions, and reconstructing the codeword, before performing the decoding process, where the reconstructed codeword includes the stored data bits in the first set of positions, the set of bits in the second set of positions, and the stored parity bits in the third set of positions.

Some examples of the method 1200 and the apparatus described herein may further include operations, features, means, or instructions for inputting the data bits into an encoder to generate the codeword, where the encoder may be configured with the placeholder bits as default logic values, and inputting the stored data bits and the stored parity bits, into a decoder to perform the decoding process, where the decoder may be configured with the set of bits as default logic values.

Some examples of the method 1200 and the apparatus described herein may further include operations, features, means, or instructions for identifying which bit in the set of bits may have the error, where the inverted set of bits includes one or more packets associated with the bit that may have the error.

Some examples of the method 1200 and the apparatus described herein may further include operations, features, means, or instructions for appending a second set of bits to the codeword before storing the codeword in the memory, where the codeword may be associated with a second ratio of logic values after appending the second set of bits, and storing the second set of bits in the memory along with the data bits and the parity bits.

Some examples of the method 1200 and the apparatus described herein may further include operations, features, means, or instructions for determining a reference voltage based on the second ratio of logic values associated with the codeword, and reading the data bits, the parity bits, and the second set of bits from the memory based on the determined reference voltage.

Figure 13:
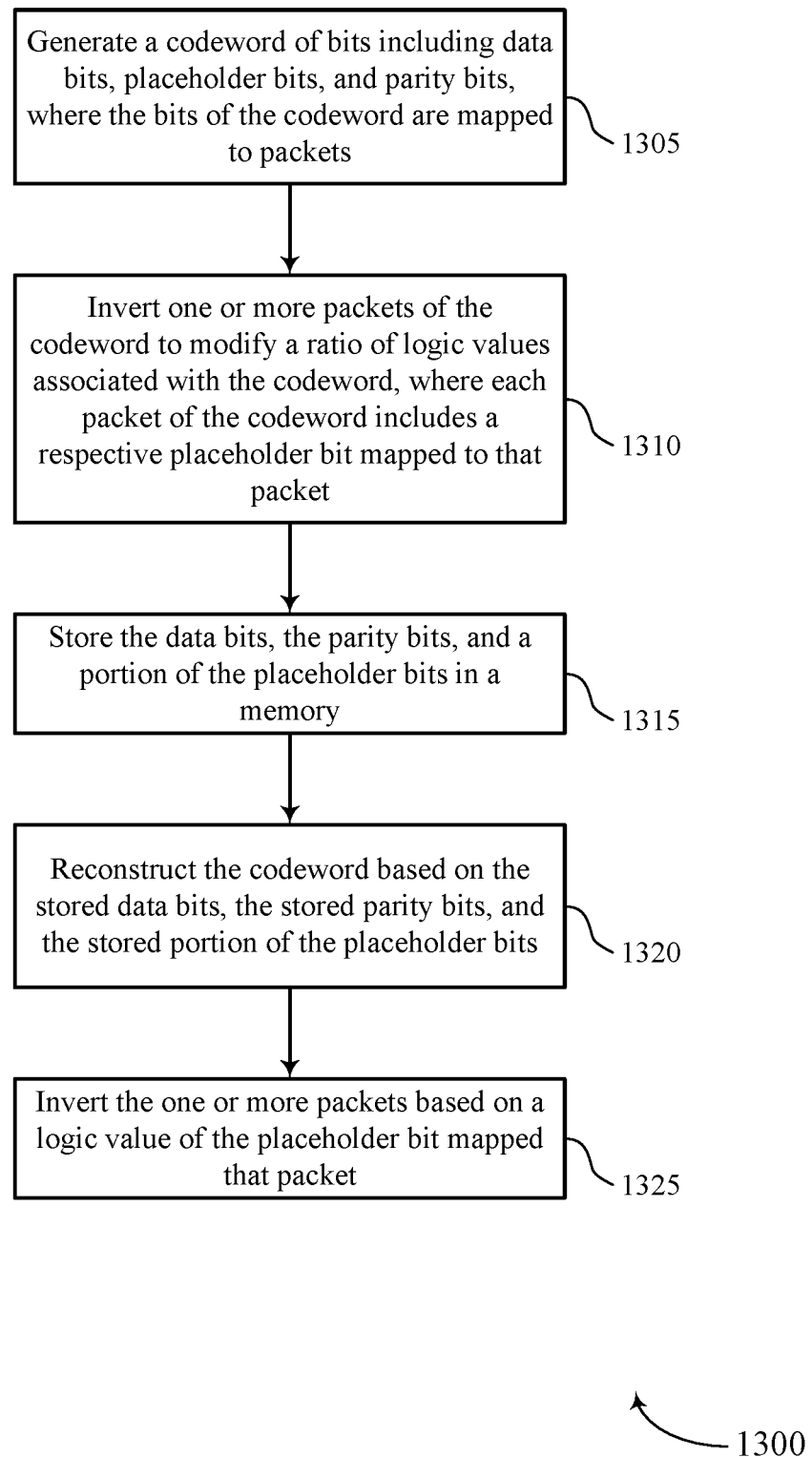

FIG. 13 shows a flowchart illustrating a method or methods 1300 that supports generating a balanced codeword protected by an error correction code in accordance with examples as disclosed herein. The operations of method 1300 may be implemented by a memory device or its components as described herein. For example, the operations of method 1300 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1305, the memory device may generate a codeword of bits including data bits, placeholder bits, and parity bits, where the bits of the codeword are mapped to packets. The operations of 1305 may be performed according to the methods described herein. In some examples, aspects of the operations of 1305 may be performed by an encoder module as described with reference to FIG. 9.

At 1310, the memory device may invert one or more packets of the codeword to modify a ratio of logic values associated with the codeword, where each packet of the codeword includes a respective placeholder bit mapped to that packet. The operations of 1310 may be performed according to the methods described herein. In some examples, aspects of the operations of 1310 may be performed by a balancing module as described with reference to FIG. 9.

At 1315, the memory device may store the data bits, the parity bits, and a portion of the placeholder bits in a memory. The operations of 1315 may be performed according to the methods described herein. In some examples, aspects of the operations of 1315 may be performed by a memory module as described with reference to FIG. 9.

At 1320, the memory device may reconstruct the codeword based on the stored data bits, the stored parity bits, and the stored portion of the placeholder bits. The operations of 1320 may be performed according to the methods described herein. In some examples, aspects of the operations of 1320 may be performed by a decoder module as described with reference to FIG. 9.

At 1325, the memory device may invert the one or more packets based on a logic value of the placeholder bit mapped that packet. The operations of 1325 may be performed according to the methods described herein. In some examples, aspects of the operations of 1325 may be performed by an unbalancing module as described with reference to FIG. 9.

In some examples, an apparatus as described herein may perform a method or methods, such as the method 1300. The apparatus may include features, means, or instructions (e.g., a non-transitory computer-readable medium storing instructions executable by a processor) for generating a codeword of bits including data bits, placeholder bits, and parity bits, where the bits of the codeword are mapped to packets, inverting one or more packets of the codeword to modify a ratio of logic values associated with the codeword, where each packet of the codeword includes a respective placeholder bit mapped to that packet, storing the data bits, the parity bits, and a portion of the placeholder bits in a memory, reconstructing the codeword based on the stored data bits, the stored parity bits, and the stored portion of the placeholder bits, and inverting the one or more packets based on a logic value of the placeholder bit mapped that packet.

In some examples of the method 1300 and the apparatus described herein, storing the portion of the placeholder bits may include operations, features, means, or instructions for determining, for each of the one or more packets, that the logic value of the placeholder bit mapped to that packet may be different than an expected logic value for that placeholder bit, where the one or more packets may be in inverted based on the determination.

In some examples of the method 1300 and the apparatus described herein, the expected logic value for each placeholder bit includes a logic value of that placeholder bit before the first inversion of the one or more packets.

Some examples of the method 1300 and the apparatus described herein may further include operations, features, means, or instructions for using a set of bits in place of the remainder of the placeholder bits to reconstruct the codeword, and determining an error in the set of bits based on a decoding process performed on the reconstructed codeword, where the one or more packets may be inverted based on the error in the set of bits.

In some examples, an apparatus may be configured to, or operable to, perform the operations of the method 1000, the method 1100, the method 1200, and/or the method 1300. The apparatus may include a decoder including a first set of inputs coupled with a memory and a second set of inputs permanently coupled with a reference voltage, the decoder configured to decode a codeword based at least in part on bits sensed from the memory and bits represented by the reference voltage. The apparatus may also include a logic gate coupled with the memory and the decoder, and the logic gate may be configured to invert a bit of the bits sensed from the memory based at least in part on a control signal output by the decoder.

In some examples, where the logic gate includes an XOR logic gate. In some examples, the XOR logic gate includes a first input configured to receive the bit sensed from the memory; and a second input configured to receive the control signal from the decoder, where the control signal is associated with a packet, of the codeword, to which the bit is mapped.

In some examples, the logic gate is configured to invert a second bit of the bits sensed from the memory based at least in part on the control signal output by the decoder, where the second bit is mapped to the packet.

In some examples, the apparatus further includes a second logic gate coupled with the memory and the decoder, the second logic gate configured to invert a second bit of the bits sensed from the memory based at least in part on a second control signal output by the decoder, where the second control signal is associated with a second packet, of the codeword, to which the second bit is mapped.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a decoder including a first set of inputs coupled with a memory and a second set of inputs permanently coupled with a reference voltage, the decoder configured to decode a codeword based on bits sensed from the memory and bits represented by the reference voltage and a logic gate coupled with the memory and the decoder, the logic gate configured to invert a bit of the bits sensed from the memory based on a control signal output by the decoder.

In some examples, the logic gate may include operations, features, means, or instructions for a first input configured to receive the bit sensed from the memory, and a second input configured to receive the control signal from the decoder, where the control signal may be associated with a packet, of the codeword, to which the bit may be mapped.

In some examples, the logic gate may be configured to invert a second bit of the bits sensed from the memory based on the control signal output by the decoder, where the second bit may be mapped to the packet.

Some examples of the apparatus may include a second logic gate coupled with the memory and the decoder, the second logic gate configured to invert a second bit of the bits sensed from the memory based on a second control signal output by the decoder, where the second control signal may be associated with a second packet, of the codeword, to which the second bit may be mapped.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "portion" may refer to at least some, and potentially all, of all of the underlying object, whereas the term "subset" may refer to a fraction of the underlying object (e.g., less than the whole). As an example, storing a portion of a codeword may refer to storing only a part of the codeword or all of the codeword. Storing a subset of a codeword may refer to storing only a part of the codeword (with a remaining part of the codeword being un-stored).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   generating a codeword of bits comprising data bits, placeholder bits, and parity bits, wherein the bits of the codeword are mapped to packets;
   inverting one or more packets of the codeword to modify a ratio of logic values associated with the codeword, wherein a validity of the codeword is maintained after inverting the one or more packets;
   storing a portion of the codeword in a set of memory cells, the portion of the codeword comprising the data bits and the parity bits and excluding the placeholder bits;
   decoding the codeword based at least in part on the parity bits stored in the set of memory cells, the data bits stored in the set of memory cells, and a set of bits in place of the placeholder bits, wherein each bit of the set of bits is associated with a respective packet of the packets; and
   inverting the one or more packets based at least in part on an error in the set of bits detected by decoding the codeword.

2. The method of claim 1, further comprising:
   appending a second set of bits to the codeword based at least in part on the ratio of logic values associated with the codeword after inverting the one or more packets, wherein appending the second set of bits further modifies the ratio of logic values associated with the codeword; and
   storing the second set of bits to in the set of memory cells along with the data bits and the parity bits.

3. The method of claim 1, further comprising:
   selecting a reference voltage based at least in part on the ratio of logic values associated with the codeword after inverting the one or more packets; and
   sensing the set of memory cells based at least in part on the reference voltage.

4. The method of claim 1, wherein the placeholder bits occupy a plurality of positions in the codeword, the method further comprising:
   adding the set of bits to the codeword, wherein the set of bits occupy the plurality of positions previously occupied by the placeholder bits.

5. The method of claim 1, further comprising:
   receiving the data bits and a write command; and
   inputting the data bits and the placeholder bits into an encoder associated with a matrix that enables detection of multiple errors, wherein the parity bits are output by the encoder.

6. The method of claim 5, wherein the bits of the codeword are mapped to the packets based at least in part on the matrix associated with the encoder, and wherein the matrix is associated with a decoder used to decode the codeword.

7. The method of claim 5, wherein the packets comprise a quantity of bits greater than or equal to a distance of the matrix.

8. The method of claim 1, wherein the packets are sequentially indexed, the method further comprising:
   determining that the one or more packets were inverted based at least in part on a coding scheme associated with the set of bits, wherein the error detected in the set of bits indicates a last packet, index-wise, of the one or more packets that were inverted.

9. The method of claim 1, wherein decoding the codeword comprises:
   inputting the stored data bits, the stored parity bits, and the set of bits into a decoder that is configured to detect multiple errors; and
   detecting a second error in the stored data bits or the stored parity bits based at least in part on an output of the decoder.

10. A method, comprising:
    constructing a codeword of bits comprising data bits, placeholder bits, and parity bits;
    inverting a plurality of the bits of the codeword to modify a ratio of logic values associated with the codeword;
    storing the data bits and the parity bits in a set of memory cells after inverting the plurality of the bits;
    performing a decoding process on the stored data bits, the stored parity bits, and a set of bits that represent the placeholder bits; and
    inverting the plurality of the bits that were inverted based at least in part on the decoding process detecting an error in the set of bits.

11. The method of claim 10, further comprising:
    discarding the placeholder bits after inverting the plurality of the bits; and
    reconstructing the codeword based at least in part on the stored data bits, the stored parity bits, and the set of bits, wherein the decoding process is performed on the reconstructed codeword and wherein the set of bits are positioned in the codeword as the placeholder bits.

12. The method of claim 10, further comprising:
    associating each bit of the set of bits with a respective combination of bits of the codeword, wherein a bit of the set of bits is associated with the plurality of the bits; and determining that the plurality of the bits were inverted based at least in part on the error in the set of bits comprising an error in the bit associated with the plurality of the bits.

13. The method of claim 10, wherein the plurality of the bits comprises one or more packets of bits, and wherein inverting the plurality of the bits comprises:
inverting the one or more packets to reach a ratio of logic values, wherein each packet of the one or more packets comprises a collection of bits that can be inverted without a decoding process detecting the inversion.

14. The method of claim 10, wherein the set of memory cells is associated with the codeword, the method further comprising:
determining a second set of bits based at least in part on the modified ratio of logic values associated with the codeword; and
storing, along with the data bits and the parity bits, the second set of bits in the set of memory cells associated with the codeword.

15. The method of claim 10, further comprising:
receiving a read command for the data bits after storing the data bits and the parity bits in the set of memory cells;
reading, based at least in part on the read command, the data bits and the parity bits from the set of memory cells; and
inputting the data bits and the parity bits into a decoder as part of the decoding process.

16. The method of claim 15, further comprising:
inputting the set of bits into the decoder, wherein the set of bits is transferred to the decoder from a voltage reference permanently coupled with the decoder.

17. A method, comprising:
inverting a plurality of bits of a codeword that comprises data bits, placeholder bits, and parity bits;
storing the codeword, excluding the placeholder bits, in memory after inverting the plurality of bits;
performing a decoding process on the stored data bits, the stored parity bits, and a set of bits in place of the placeholder bits; and
inverting the plurality of bits of the codeword based at least in part on an error detected in the set of bits during the decoding process.

18. The method of claim 17, further comprising:
constructing the codeword, wherein the codeword comprises the data bits in a first set of positions, the placeholder bits in a second set of positions, and the parity bits in a third set of positions; and
reconstructing the codeword, before performing the decoding process, wherein the reconstructed codeword comprises the stored data bits in the first set of positions, the set of bits in the second set of positions, and the stored parity bits in the third set of positions.

19. The method of claim 17, further comprising:
inputting the data bits into an encoder to generate the codeword, wherein the encoder is configured with the placeholder bits as default logic values; and
inputting the stored data bits and the stored parity bits, into a decoder to perform the decoding process, wherein the decoder is configured with the set of bits as default logic values.

20. The method of claim 17, further comprising:
identifying which bit in the set of bits has the error, wherein the inverted plurality of bits comprises one or more packets associated with the bit that has the error.

21. The method of claim 17, wherein the codeword is associated with a first ratio of logic values after inverting the plurality of bits, the method further comprising:
appending a second set of bits to the codeword before storing the codeword in the memory, wherein the codeword is associated with a second ratio of logic values after appending the second set of bits; and
storing the second set of bits in the memory along with the data bits and the parity bits.

22. The method of claim 21, further comprising:
determining a reference voltage based at least in part on the second ratio of logic values associated with the codeword; and
reading the data bits, the parity bits, and the second set of bits from the memory based at least in part on the determined reference voltage.

23. A method, comprising:
generating a codeword of bits comprising data bits, placeholder bits, and parity bits, wherein the bits of the codeword are mapped to packets;
inverting one or more packets of the codeword to modify a ratio of logic values associated with the codeword, wherein each packet of the codeword comprises a respective placeholder bit mapped to that packet;
storing the data bits, the parity bits, and a portion of the placeholder bits in a memory;
reconstructing the codeword based at least in part on the stored data bits, the stored parity bits, and the stored portion of the placeholder bits; and
inverting the one or more packets based at least in part on a logic value of the placeholder bit mapped that packet.

24. The method of claim 23, wherein storing the portion of the placeholder bits comprises storing all the placeholder bits, the method further comprising:
determining, for each of the one or more packets, that the logic value of the placeholder bit mapped to that packet is different than an expected logic value for that placeholder bit, wherein the one or more packets are in inverted based at least in part on the determination.

25. The method of claim 24, wherein the expected logic value for each placeholder bit comprises a logic value of that placeholder bit before inverting the one or more packets.

26. The method of claim 23, wherein the portion of the placeholder bits excludes a remainder of the placeholder bits, the method further comprising:
using a set of bits in place of the remainder of the placeholder bits to reconstruct the codeword; and
determining an error in the set of bits based at least in part on a decoding process performed on the reconstructed codeword, wherein the one or more packets are inverted based at least in part on the error in the set of bits.

* * * * *